(12) United States Patent
Stam et al.

(10) Patent No.: US 7,700,906 B2
(45) Date of Patent: *Apr. 20, 2010

(54) OPTICAL ELEMENTS, RELATED MANUFACTURING METHODS AND ASSEMBLIES INCORPORATING OPTICAL ELEMENTS

(75) Inventors: Joseph S. Stam, Holland, MI (US); Jon H. Bechtel, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/017,194

(22) Filed: Jan. 21, 2008

(65) Prior Publication Data

US 2008/0128599 A1    Jun. 5, 2008

Related U.S. Application Data

(63) Continuation of application No. 10/921,076, filed on Aug. 18, 2004, now Pat. No. 7,321,112.

(60) Provisional application No. 60/495,906, filed on Aug. 18, 2003.

(51) Int. Cl.
   G01J 3/50 (2006.01)
   H01L 27/00 (2006.01)

(52) U.S. Cl. .................... 250/226; 250/208.1

(58) Field of Classification Search .......... 250/208.1, 250/216, 226, 201.5; 348/267; 359/615, 359/619, 618, 640, 559; 356/300, 4.04
   See application file for complete search history.

(56) References Cited

U.S. PATENT DOCUMENTS

| 4,388,128 | A |  | 6/1983 | Ogawa |  |
|---|---|---|---|---|---|
| 4,472,735 | A | * | 9/1984 | Shinozaki et al. | 348/291 |
| 4,761,682 | A | * | 8/1988 | Asaida | 348/265 |
| 4,989,959 | A | * | 2/1991 | Plummer | 359/640 |
| 5,477,381 | A |  | 12/1995 | Sasaki |  |
| 5,548,444 | A |  | 8/1996 | McLaughlin et al. |  |
| 5,570,145 | A |  | 10/1996 | Soneda |  |
| 5,834,761 | A |  | 11/1998 | Okada et al. |  |
| 6,549,336 | B2 |  | 4/2003 | Tamaru et al. |  |
| 2002/0040962 | A1 | * | 4/2002 | Schofield et al. | 250/208.1 |
| 2002/0121652 | A1 | * | 9/2002 | Yamasaki | 257/222 |
| 2003/0173503 | A1 | * | 9/2003 | Tocci et al. | 250/216 |

FOREIGN PATENT DOCUMENTS

EP    0 773 673 A    5/1997

OTHER PUBLICATIONS

Communication from the European Patent Office, Supplementary European Search Report, Jan. 1, 2010, (3 pages).

(Continued)

*Primary Examiner*—Que T Le
*Assistant Examiner*—Jennifer Bennett
(74) *Attorney, Agent, or Firm*—Price, Heneveld, Cooper, DeWitt & Litton, LLP

(57) ABSTRACT

The present invention relates to various optical elements, related manufacturing methods and systems incorporating the optical elements. In at least one embodiment an optical element is provided that improves a vision system's capability to accurately measure a spectral characteristic of a distant light source.

24 Claims, 24 Drawing Sheets

OTHER PUBLICATIONS

Communication from the United States Patent Office, Final Office Action mailed on Mar. 14, 2007, (11 pages).
Communication from the United States Patent Office, Non-Final Office Action mailed on Sep. 19, 2006, (11 pages).
Communication from the United States Patent Office, Final Office Action mailed on Mar. 16, 2006, (10 pages).
Communication from the United States Patent Office, Non-Final Office Action mailed on Dec. 6, 2005, (10 pages).

* cited by examiner

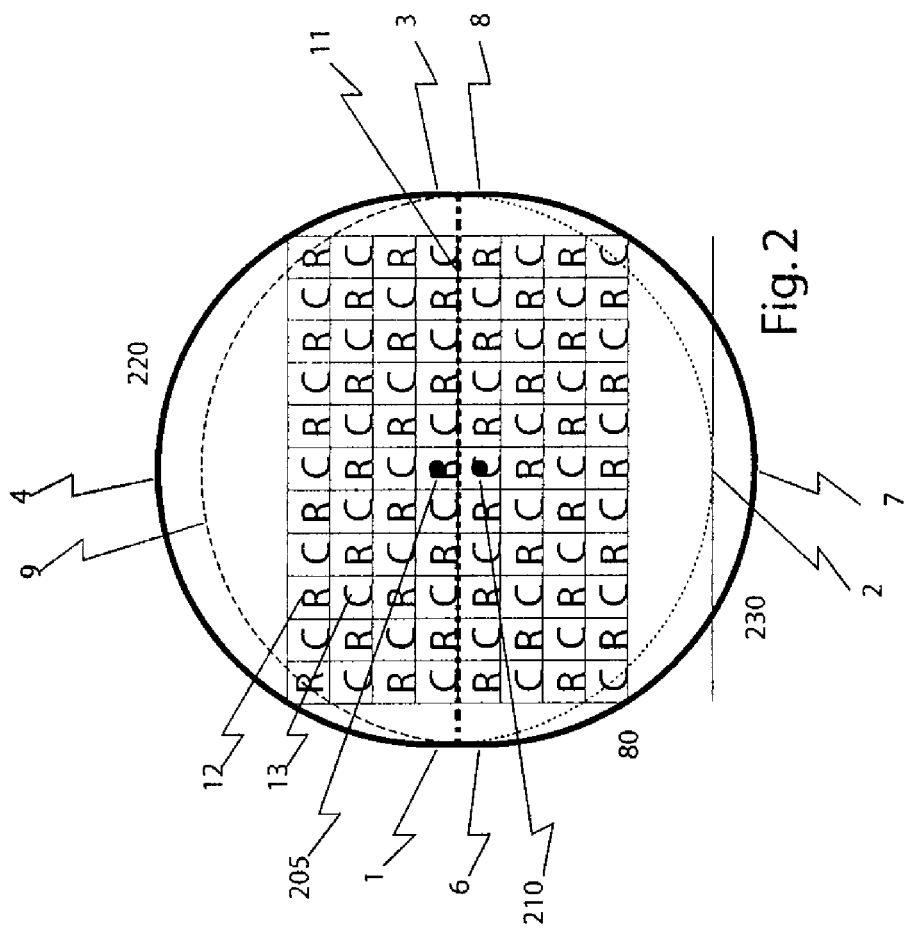
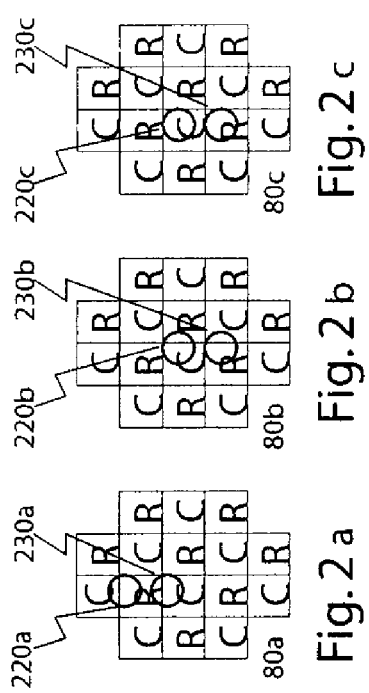
Fig. 2
Fig. 2a  Fig. 2b  Fig. 2c

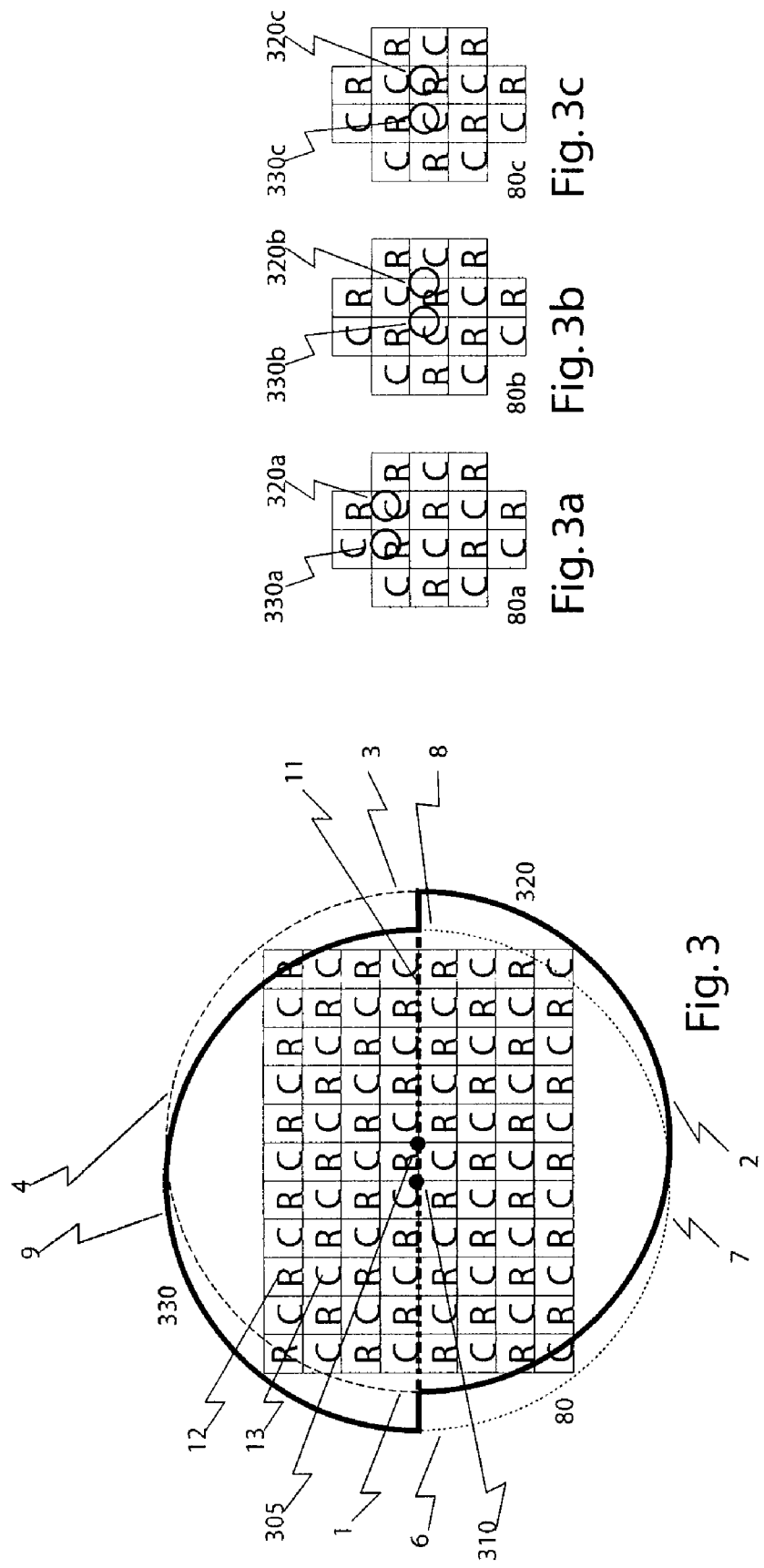

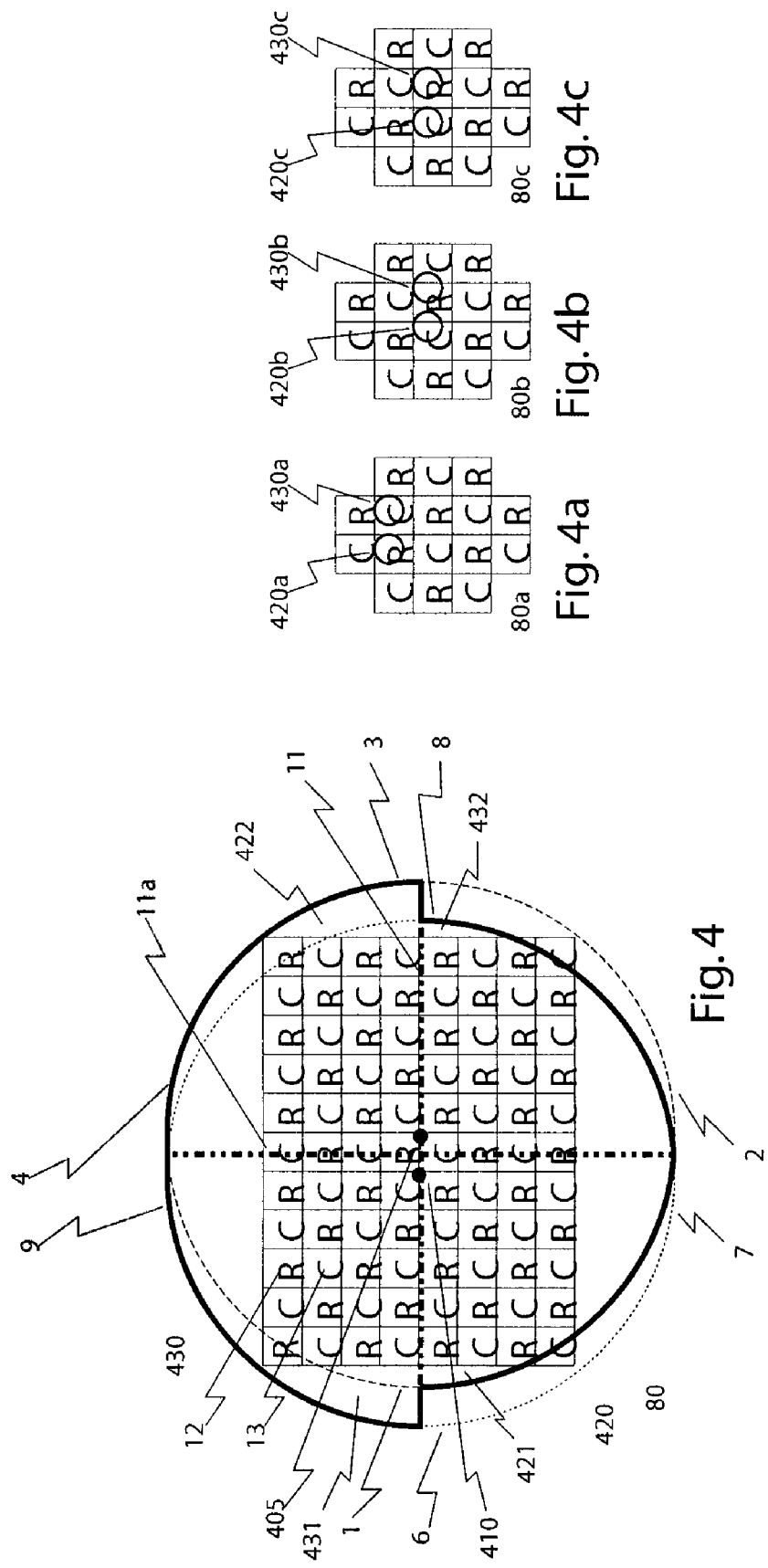

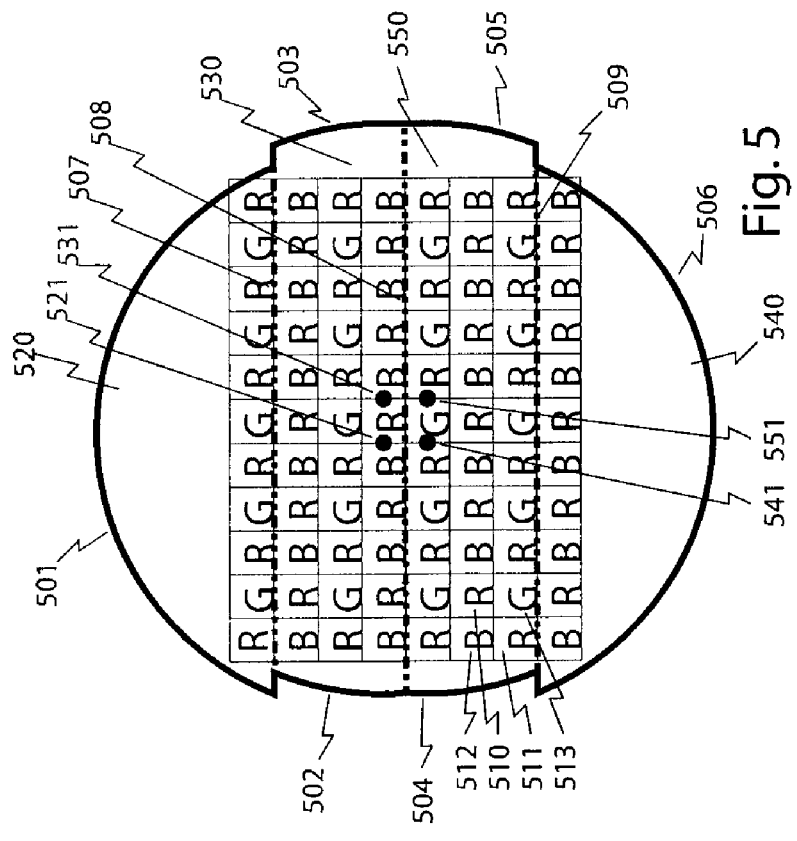
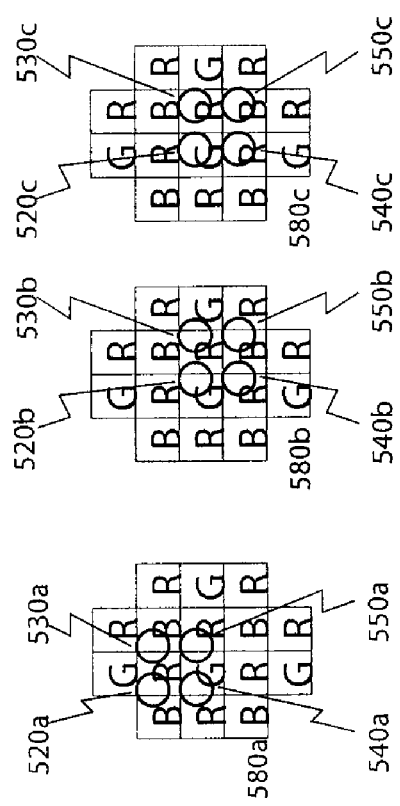
Fig. 5
Fig. 5c
Fig. 5b
Fig. 5a

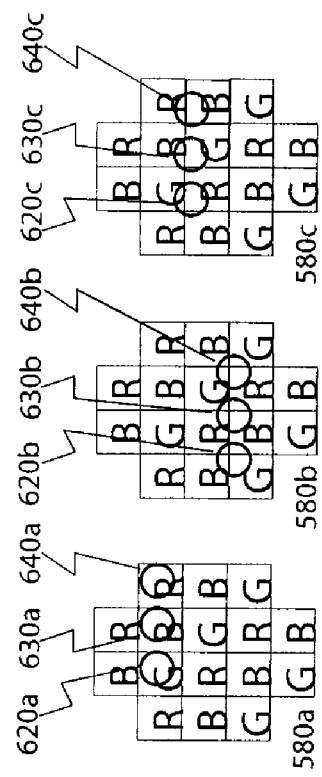
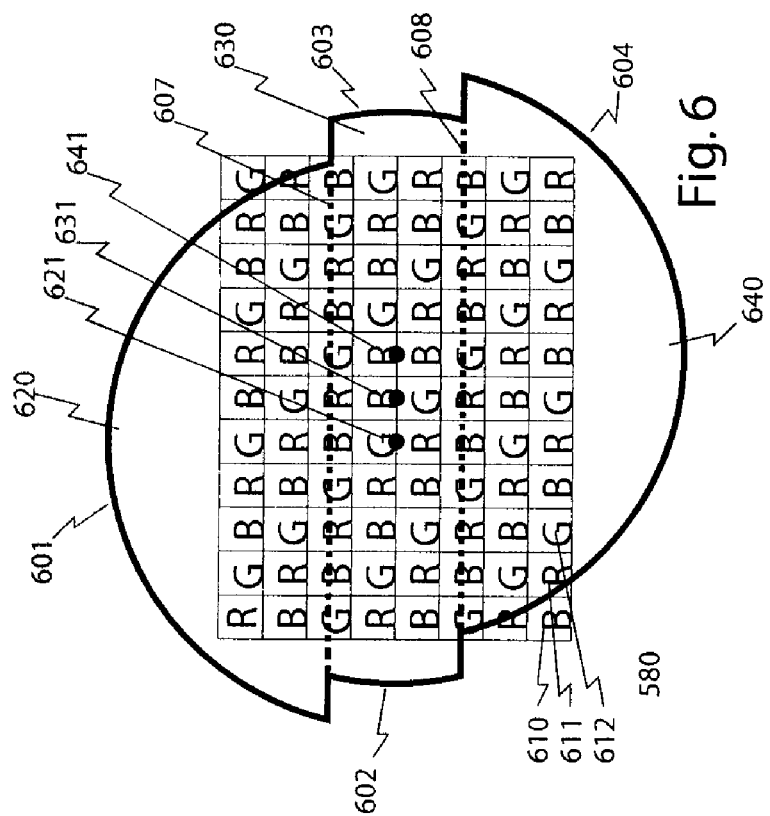

1301
1300

1401
1400  1402

1500  1501  1502  1503  1504

2400

2400a

OPTICAL ELEMENTS, RELATED MANUFACTURING METHODS AND ASSEMBLIES INCORPORATING OPTICAL ELEMENTS

CROSS-REFERENCE TO RELATED APPLICATIONS

This application is a continuation of U.S. patent application Ser. No. 10/921,076, filed on Aug. 18, 2004, now U.S. Pat. No. 7,321,112, which claims priority under 35 U.S.C. §119(e) to U.S. Provisional Patent Application No. 60/495,906, filed on Aug. 18, 2003, the entire disclosures of which are incorporated herein in their entirety by reference.

BACKGROUND OF THE INVENTION

The present invention relates to optics for imaging applications. It has become commonplace to employ digital imaging technology in a host of consumer electronic devices, residential systems, commercial systems and industrial applications. Often times it is desirable to impart accurate color rendering in related devices and systems.

For color imaging arrays, it is common to cover each pixel of the array with a color spectral filter so that each pixel will respond to the color determined by its associated spectral filter. In this way, each pixel responds only to a particular color or range of colors. A system of interpolation, extrapolation and/or averaging must be used to "fill in" the two missing colors at each pixel site. For relatively large blocks of colors, this presents very little problems. However, when small details are present such as that created by a fine pattern in a projected image or by small spots such as that created by distant headlamps or tail lamps in the projected image, the system often has serious errors in the determination of colors for small details within the image. The effects become particularly pronounced and noticeable when the pattern in the projected image is repeated with spatial frequency components which approach or exceed one-half of the spatial sampling frequency for related color components in the imaging array. Larger scale interference patterns often create particularly annoying artifacts in the resulting images.

A number of approaches have been used to minimize these problems. A recent approach provides an imager for which each pixel site responds separately to each of the three color components making it unnecessary to fill in missing colors (Foveon). Such systems are proprietary and have limitations in performance. A second technique is to separate the image into separate images for each of the color components and to use individual sensors for each of these single color component images. This approach is used for high-end video cameras but requires multiple imagers and a quite complicated optical system. A third approach is to intentionally blur or diffuse the image enough that the projected spots extend over several neighboring pixel areas so that the image of a small detail will never be contained in a pixel of a single color component. The problem with this approach is that unless the blur spot is very large, the percentage of the light which falls on pixels of each color will vary considerably as the image assumes various positions on the sensing pixel array. The result is that the color rendition will vary accordingly. When a very accurate color rendition is required for small details, the only apparent solution is to increase the diffusion or blurring of the image to improve the averaging. As the diameter of the blur spot increases to several pixels, the effective resolution of the sensor decreases rapidly. High resolution is normally a highly valued feature of an imager and the physical design problems and the cost of the imager and its associated image processing and image storage components increase with the number of pixels. It is important to achieve the necessary accuracy in color rendition without an unnecessary increase in the number of pixels needed to achieve a given resolution.

Very high-end digital cameras often incorporate filters which include multiple layers of birefringence material to project a multiple image onto the sensor surface. To this end, the intent and the results are similar to those intended in this invention. However, the technique is very expensive and in many implementations requires a relatively thick filter assembly which often adds distortion for lenses which are not typically designed to focus the image through a thick piece of transparent material.

BRIEF DESCRIPTION OF THE DRAWINGS

FIGS. 1 and 1a-1c depict an embodiment of a spectral filter pattern;

FIGS. 2 and 2a-2c depict an embodiment of a spectral filter pattern;

FIGS. 3 and 3a-3c depict an embodiment of a spectral filter pattern;

FIGS. 4 and 4a-4c depict an embodiment of a spectral filter pattern;

FIGS. 5 and 5a-5c depict an embodiment of a spectral filter pattern;

FIGS. 6 and 6a-6c depict an embodiment of a spectral filter pattern;

FIGS. 10, 10a and 10b depict various embodiments with details of imaging systems;

Figure 1:
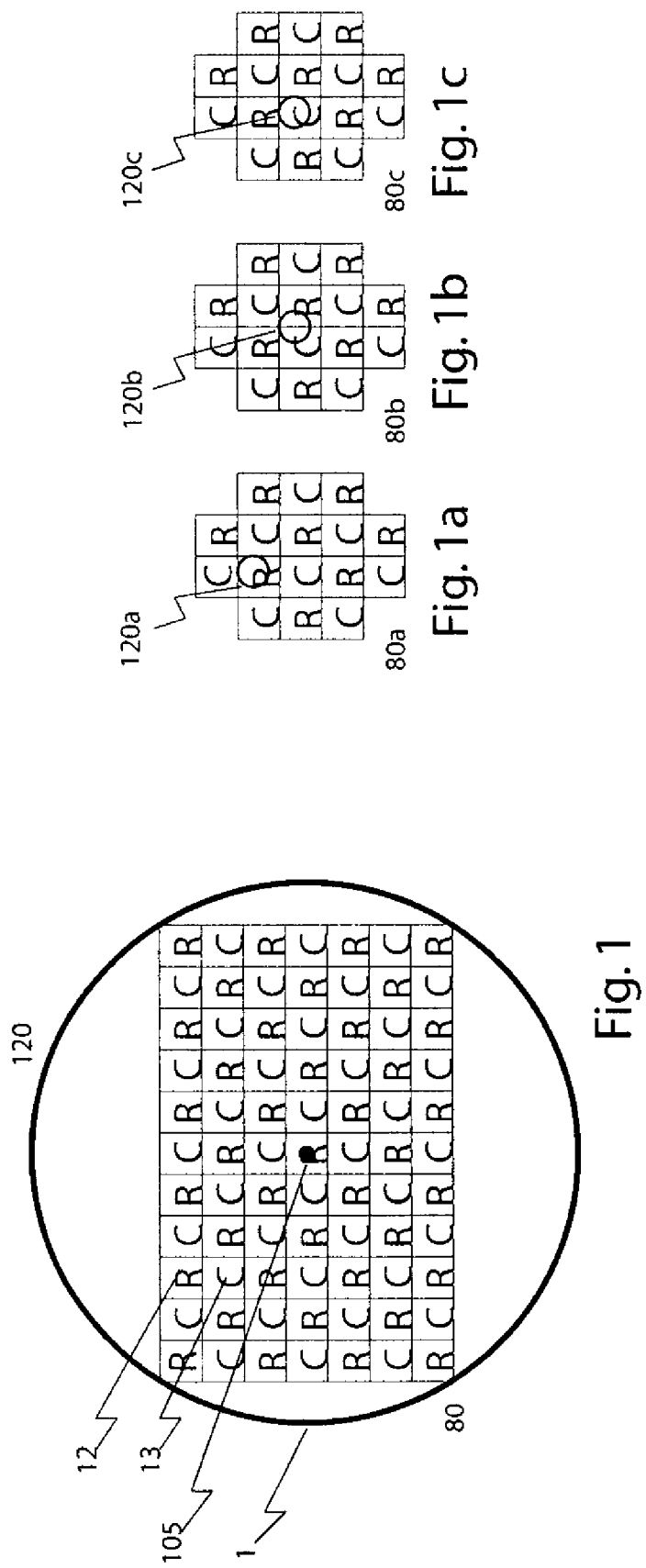

Imaging systems are becoming commonplace in consumer electronics devices, residential systems, commercial systems and industrial applications. Consumer electronic devices include digital cameras, electronic video recorders, direct video devices (DVDs), digital video-telephones and the like. Residential systems include security systems, monitoring devices, surveillance systems, home entertainment systems and the like. Vehicle vision systems often incorporate imaging systems for equipment control, monitoring apparatus, warning devices and security systems. Industrial applications may include machine vision systems, control systems, monitoring systems and the like.

DETAILED DESCRIPTION OF THE INVENTION

Automatic vehicle exterior light control systems are described in commonly assigned U.S. Pat. Nos. 5,990,469, 6,008,486, 6,130,421, 6,130,448, 6,255,639, 6,049,171, 5,837,994, 6,403,942, 6,281,632, 6,291,812, 6,469,739, 6,399,049, 6,465,963, 6,587,573, 6,429,594, 6,379,013, 6,861,809, and 6,774,988; and U.S. patent application Ser. Nos. 09/678,856, 09/847,197, 10/645,801, 10/783,131, 10/777,468, and 10/783,273, the disclosures of which are incorporated in their entireties herein by reference. Moisture sensors and windshield fog detector systems are described in commonly assigned U.S. Pat. Nos. 5,923,027 and 6,313,457, the disclosures of which are incorporated in their entireties herein by reference. It should be understood that the scope of the present invention is intended to include vehicle equipment control systems which incorporate at least one imaging system. The control systems may comprise exterior light control systems, moisture detection, security systems, occupancy detection systems, lane departure warning systems, vision systems with monitors, rear vision systems and the like.

For digital color imaging applications where a color filter array is used, the colors in the array are normally selected to meet the requirements of the application. For photographic or other picture rendering applications, it is customary to use a Bayer pattern array in which the smallest unit of the color array which may be replicated in a step and repeat pattern to produce the entire array has four pixels with one red, two green, and one blue filtered pixels making up the smallest unit. It should be understood that there is often more than one way to select the smallest unit of a color array. For this reason, in the ensuing discussion, we will refer to a particular instance of the array defined above as the selected or associated smallest unit array to avoid the necessity of completely repeating the definition and the confusion of arbitrarily switching from one smallest unit array to another. The smallest unit array for the Bayer pattern is often formed with four pixels organized in a square array with two green spectrally filtered pixels along one diagonal and a red and a blue spectrally filtered pixel along the other diagonal. Sometimes, complementary cyan, magenta, and yellow spectral filters are used in place of the red, green, and blue spectral filters such as positive or negative films are used in film cameras. The principles of the present invention are applicable to either system. The selected smallest unit array by its selection criteria may be extended by a step and repeat process to cover the pixels in the entire imaging array. For the Bayer pattern, the result is that there are four identical patterns of pixels generated, each pattern containing pixels with only one color component. It should be understood that a color spectral filter normally passes some range of colors which may not even be contiguous and that there is often overlap in the color transmission characteristic for separate color components in a color filter array. The terms "color" and "color component" are generally intended to designate the color transmission characteristic and each pattern corresponds to exactly one pixel in the associated smallest unit array. Each pixel in the pattern has the same color as its associated pixel in the associated smallest unit array. Also, the relative position or displacement of each of the patterns relative to each of the others should be substantially the same as the relative position or displacement of each of the corresponding pixels in the associated smallest unit array. In the case of the Bayer array, since there were two green pixels in the associated smallest unit array, there will be two patterns made up of green pixels and one pattern each for the red and for the blue pixels. Each of these patterns is substantially identical in shape to each of the others and consists of a square array of alternate pixels from the imager array. As noted above, each pattern is displaced from the other by the same distance that the corresponding pixels in the associated smallest unit color array are displaced from one another. An important aspect of the invention is that if the image is processed by the optical system so that it is projected on the imager as a multiple image such that each of the images in the multiple image set is of approximately the same intensity, such that there is one or there are the same number of images for each of the colors in the smallest unit array, and such that the pattern of the offsets between these images matches the pattern of offsets between the pixels of the selected or of another satisfactory smallest unit of the color array, then with appropriate analysis of the captured image the ratio-metric response of the imager to each color component in the projected image will be substantially independent of the position or size of the projected image element on the imaging array.

The number of pixels in an imager is normally very large. A low-resolution imager may, for example, have hundreds or thousands of pixels and a relatively high-resolution imager may have many millions of pixels. In any event, the width of pixel sites in an imager is usually in a range of several micrometers to several tens of micrometers. For clarity in the drawings, pixel widths have been depicted typically as several tenths of an inch for pictorial clarity. The result is that in the figures, the size of both the pixels and the dimensions of the related lens offsets are exaggerated often many thousands of times. In the real lenses, these offsets would normally be approximately equal to the pixel widths and would often be too small to even be seen without magnification.

Turning to FIG. 1, a lens 120 has an outline 1 and a center 105. It focuses an image on a pixel array 80 which has an array of pixels 12 covered by red filters, and an array of pixels 13 with no (clear) filters. FIGS. 1a, 1b, and 1c depict portions 80a, 80b, and 80c of the pixel array. Small circles 120a, 120b, and 120c depict the images of distant small area light sources which are projected on various places on the imaging array. Spot 120a falls entirely on a red pixel so regardless of its color, it will result in a reading having primarily red content. Spot 120b falls on both a red and a clear pixel so that its color content may be read properly. Spot 120c falls entirely on a clear pixel so that regardless of its color, it will result in a reading having primarily clear content. For applications, such as headlamp control, which require reading the color of the images of small area headlamp and tail lamp sources to distinguish one from the other, this is unsatisfactory performance.

With reference now to FIG. 2, the smallest unit array is selected as a vertical pair of clear and red pixels. A double image in which one of the images is vertically separated from the other by a distance equal to the pixel spacing is created by the lens structure of FIG. 2. As depicted in FIG. 2, the lens is made up of two portions 220 and 230. Each portion of the lens may be identical to slightly more than half of lens 120. Lens portion 220 has a periphery which extends from 1 to cutaway portion 2 to 3 to 4 and back to 1 and has a center 205. Lens portion 230 has a periphery which extends from 6 to 7 to 8 to cutaway portion 9 and back to 6 and has a center 210. The line along which the two lens geometries are joined is 11. In reality, there should be no actual break or optical non-uniformity in the lens material between the two portions as this would result in the unwanted reflection, obscuration, or scattering of light rays which traverse this region. As a result, it is preferable to construct a mold to provide for the lens shape and then to mold the lens as one integral piece. In some cases, the mold cavity may be directly machined. In many other cases, it may be preferable to make a precisely shaped pattern of the desired lens, for example, by cutting the required lens portions from lenses such as the one depicted in FIG. 1, micro-positioning these pieces precisely relative to one another, and cementing them together in their required configuration. During the positioning, a light source may be focused through the lens portions which are being adjusted and onto an imaging array or other target and the resulting image may be used to determine when the relative positions of the lens portions are correct. Molds for plastic lenses are often made by starting with a precise model of the desired lens shape and then electroplating a heavy nickel shell around the model. This nickel shell is then incorporated as an insert in a mold and used to mold replicas of the shape of the original model. Because of the glue lines in the original model constructed as suggested above, it may not give proper optical performance. However, the parts from the mold will have uniform clear plastic even in the area where the lens portions were joined in the model and, if properly designed and constructed, will yield proper optical performance. The lens portions 220 and 230 are positioned so that their respective centers are separated by approximately the distance between the centers of two adjacent pixels in the array. Because of this separation of the centers of the lens portions, the light image on the pixel array focused from a distant source by lens portion 220 will be about one pixel spacing higher as shown in FIG. 2 than the light image of the same distant source which is focused through lens portion 230. The actual distance between lens portion centers 205 and 210 required to achieve a spacing of one pixel distance between the centers of the projected images of a common source should be determined preferably by calculation, by simulation, and/or by experiment. This is the lens center spacing which should be used. FIGS. 2a, 2b, and 2c depict portions 80a, 80b, and 80c of the pixel array. In these respective portions of the pixel array, spots 220a, 220b, and 220c depict the image of points in the scene which are projected through lens portion 220, and spots 230a, 230b, and 230c depict the image of the same corresponding points in the scene which are projected through lens portion 230. Note that in each case the alternate image of the double image of the point falls on like portions of the pixel array except that the colors of the filters are reversed. This is exactly the effect which is desired, since, provided that the illumination of the spot projected by lens portion 220 is substantially equal to the illumination of the spot projected by lens portion 230, corresponding pixels for each color in the filter array will have substantially equal illumination and furthermore, the pattern of the illumination on the corresponding pixels on which each of the spots is projected will be substantially the same while the colors are opposite. The result is that in all three of the cases which are depicted, the relative color response to the light source should be very good even when response is not completely uniform over the pixel. Because of the pattern matching of the multiple images, the non-uniformity in illumination over individual pixels should approximately match for corresponding pixels of the various colors so that the ratio of the response to the separate colors should be accurate even when the absolute response is not accurate due to the non-uniformity in the response of the pixel over its area. For the headlamp dimming application, the accuracy of the color determination is often more important than the accuracy of the brightness determination, and experience has shown that many imagers exhibit considerable variation in response as a very small projected spot of light of constant intensity is moved to various locations on the pixel geometry. A balanced design is normally a compromise between competing objectives and in addition to the multiple image, a limited amount of general diffusion may also be desirable to minimize the effect of the non-uniformity of the response of the pixel to light over its area. In some instances, added diffusion may be introduced along with or as part of the mechanism used to introduce the multiple image. The added diffusion may in many cases be added in a way that relaxes tolerances on the optical surfaces which are used to create a multiple image and images. This is particularly true for the prism embodiments of the invention.

In an alternative embodiment for FIG. 2, lens center 205 could have been placed approximately one pixel pitch distance below lens center 210 instead of one pixel pitch distance above it. For this alternative, a pixel wide slice would effectively be subtracted from rather than being added to the lens structure. In this case, the image of a distant point projected by lens portion 220 would fall below the image projected by the lens portion 230. The functional result would be nearly the same. This would, however, reduce the feasibility of directly machining a lens mold using a lathe but would make it more feasible to directly machine a lens element using a lathe.

With further reference to FIG. 2, the smallest unit array was selected as a vertically oriented pair of red and clear pixels. It has been previously noted that the smallest unit array is normally not unique. With the checkerboard pattern of clear and red pixels, the smallest unit array may also be selected as either a horizontal pair of a clear and a red or as a horizontal pair of a red and a clear filtered pixel sensing element. For this selection of the smallest unit array, the second image of the projected double image should be displaced either one pixel distance to the left or one pixel distance to the right of a first image of the projected double image.

Turning now to FIG. 3, the lens is made up of two portions 320 and 330. Each portion of the lens may be identical to half of lens 120. Lens portion 320 has a periphery which extends from cutaway portion 1 to 2 to cutaway portion 3 to cutaway portion 4 and back to 1 and has center 305. Lens portion 330 has a periphery which extends from cutaway portion 6 to cutaway portion 7 to cutaway portion 8 to 9 and back to 6 and has center 310. The line along which the two lens geometries are joined is 11.

For construction of the lens of FIG. 3, it would be very difficult to directly machine either the lens or a mold cavity to make the lens, but the invention certainly does not preclude this possibility. The technique of precisely positioning and cementing together the lens elements as described for the construction in FIG. 2 is applicable for this configuration. The lens mold is then constructed using the nickel plating replication technique which was described for FIG. 2. As an alternative, a mold cavity could be sectioned and precisely pieced together to mold the required part. This discussion also applies to fabrication techniques for constructing the lenses of FIGS. 2, 4, 5, and 6.

The spot patterns depicted in FIGS. 3a, 3b, and 3c are similar to those of the corresponding FIGS. 2a, 2b, and 2c except that the spot images are displaced in the horizontal rather than in the vertical direction. Spreading the dot pattern in the vertical direction favors better horizontal resolution while spreading the dot pattern in the horizontal direction favors better vertical resolution. For the headlamp dimmer application, the typical pair of headlamps or the typical pair of tail lamps viewed at a distance with a relatively low resolution sensor is likely to appear as a single pixel light source anyhow, and other features of the scene also tend to have more resolvable detail in the vertical as opposed to the horizontal direction. For example, the top portion of the area of bright illumination of low beam headlamps has a relatively sharp line of cutoff extending in the horizontal direction. Also, the top extent of the illuminated portion of the road is a relatively straight line in the horizontal direction. Also, the back of a large truck which often happens to be reflective tends to produce an image which has a horizontally oriented lower cutoff just above the typical tail lamps. This is a problem, because when the projections of too much of these areas of reflection are included with the tail lamp images in a single reading, the red content of the light from the tail lamp is diluted by the reflections making it difficult to determine that the red tail lamps are present. As a result, headlamps may not be dimmed in these situations. Increased resolution in the vertical direction helps to separate light sensed from the tail lamps from the light sensed from reflections from the road just below or from bright reflections from large vehicles coming from just above the tail lamps. These considerations make the configuration of FIG. 3 generally preferable for the headlamp dimming application. It should be understood that various configurations such as the one in FIG. 6 may be rotated, preferably to select the direction for which the resolution is highest. Several more embodiments which may be configured for this same horizontally oriented double imaging will be presented and the same argument applies to them. Other embodiments may use vertical filter stripes on the sensor or may use a diagonally "striped" pixel pattern such as used in FIG. 6. This pattern may be generated by the step and repeat of a smallest unit array for which three pixels are oriented in a horizontal row. It will result in a sensor which will also have considerably greater resolution in the vertical than in the horizontal direction. The consideration of using the configuration of the multiple images to select the directions of greatest image resolution applies to those configurations also.

For the headlamp dimmer application, distant tail lamps tend to appear along a horizontal horizon line and fairly close to the center of the image in the vertical direction. Distortion in the lens which is sensitive to the position of the object in the field of view results in differences in the projected image of a distant small area light source which depends both on the position of the light source in the image and on the portion of the lens which is used to project the particular portion of the double image. The top to bottom symmetry of the lens makes the sectioning chosen relative to the portions of the scene where distant tail lamps must be detected a favorable way of sectioning the lens.

The lens of FIG. 4 is very similar to the lens of FIG. 3 except that the lens has been sectioned a second time along line 11a. The right hand quadrants 422 and 432 of the lens have been reflected about the horizontal axis 11 relative to the configuration of FIG. 3. Section 420 of the lens having center 405 now consists of the lower left-hand quadrant 421 and the upper right-hand quadrants 422. Section 430 of the lens having center 410 now consists of the upper left-hand quadrant 431 and the lower right-hand quadrant 432. The opposing quadrants of the lens having a common center should result in a more uniform spot pattern over the total field of view of the imager and the match between the spot patterns of opposing quadrants 430 and of opposing quadrants 420 should be better over the total field of view of the imager. Other than for this, the function and the performance of the lens depicted in FIG. 4 should be nearly identical to that of the lens depicted in FIG. 3.

With reference to FIG. 5, the lens is designed for use with an imager having a color filter array with a four pixel Bayer-type smallest unit array. This lens is optimized for the headlamp dimmer application where the greatest resolution is required to sense the red tail lamps. Thus, two red pixels rather than two green pixels are used in the smallest unit array. The lens is sectioned into a piece 520 having center 521, a piece 530 having center 531, a piece 540 having center 541, and a piece 550 having center 551. The centers 521, 531, 541, and 551 are arranged in a square pattern and are spaced approximately one pixel apart so that the projected quadruple images are centered approximately one pixel apart from each other. The heights of elements 520 and 540 relative to the heights of elements 530 and 550 are chosen so that the intensities of each of the four images are nearly equal when projecting a representative element from the scene onto the imaging array 580.

In FIG. 5a, a diagram of the projected image of a small area object such as a light in a scene is split into and projected as four images 520a, 530a, 540a, and 550a on the surface of imaging pixel array 80a. FIGS. 5b and 5c depict similar sets of four images 520b through 550b and 520c through 550c, which are similarly projected onto different positions on the array as the small area object assumes different locations within the scene. Inspection of the spot patterns on the underlying pixel arrays 580a, 580b, and 580c demonstrates how that for each of the three representative examples, the combined spot pattern covers corresponding and approximately equal areas for each of the color patterns which correspond to a pixel in the associated smallest unit array. Thus, with equal and corresponding areas of each of the color arrays illuminated in each case, the color response of the imager depends primarily on the color content of the light which is projected from the point in the scene onto the quadruple image on the imager.

Turning to FIG. 6, the smallest unit array is selected so that three pixels having red, green, and blue filters are arranged in a horizontal row. The step and repeat pattern used to generate the full array from the smallest element was stepped in a diagonal direction so that pixels of every color are represented in every row and every column of the array. Lens section 620 of the lens has center 621 and is bounded by radius 601 and line 607 which indicates where the two adjacent lens segments 620 and 630 are joined. Lens section 630 of the lens has center 631 and is bounded by radius 602 and radius 603 and by joining lines 607 and 608. Lens section 640 of the lens has lens center 641 and is bounded by radius 604 and by line 608 which indicates where the two adjacent lens segments 630 and 640 are joined. The three centers 621, 631, and 641 lie on a horizontal straight-line and are spaced one pixel width from one to the next. As with FIG. 5, the relative widths of sections 620 and 640 relative to the width of section 630 should be determined so that the intensities of the images projected by each at the sections will be nearly equal. FIG. 6a depicts an image of a distant small area source which forms spots 620a, 630a, and 640a on portion 580a of the imaging array. FIGS. 6b and 6c depict images which fall on the other portions of the array. Again, compare these images and note how equal areas and pixel portions of each filter color are illuminated in each of the three examples. Thus, in each case, the color response of the pixel sensing array will be primarily dependent on the color content of the light which is projected onto the imaging array.

Figure 7:
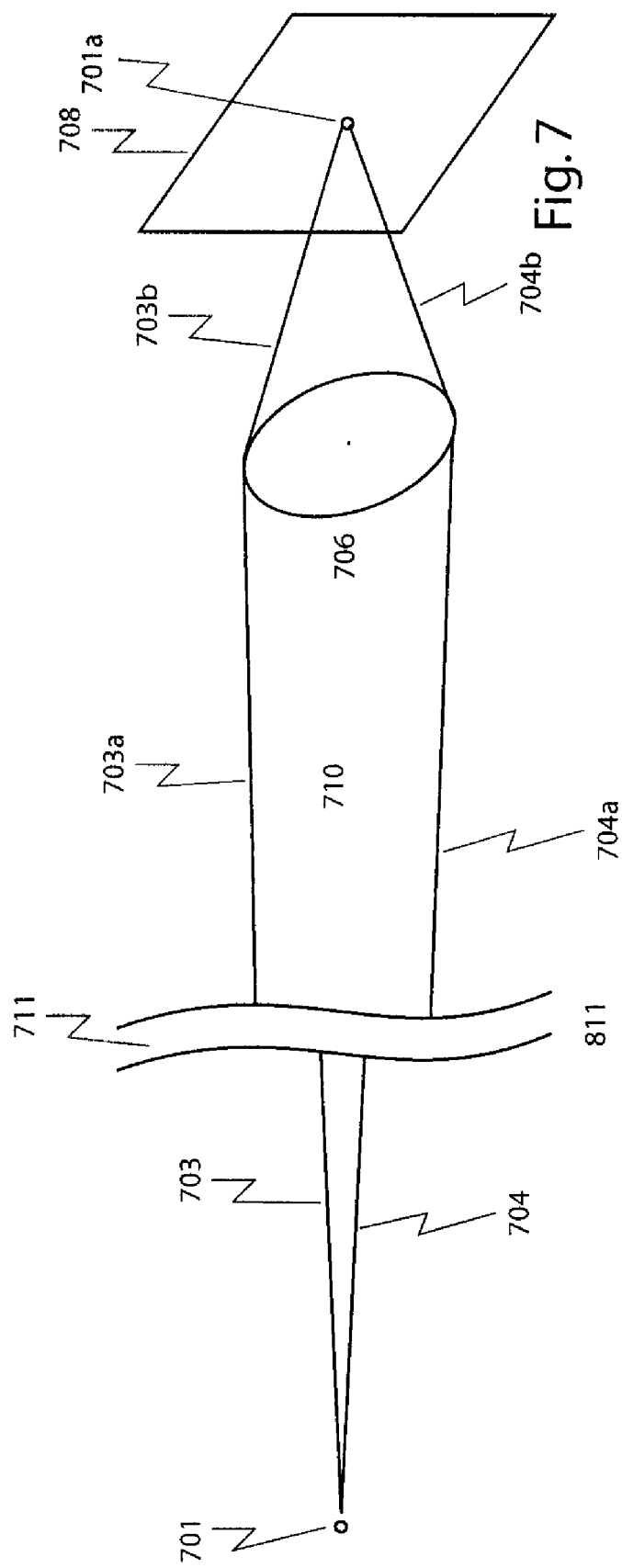
FIG. 7 depicts an embodiment of an imaging system.

FIG. 7 is a diagram which depicts a distant small area light source 701 which is focused as a spot 701a on imaging plane 708 by lens 706. 711 is a break denoting the relatively large distance of point 701 from the imaging lens 706. Lines 703 and 703a depict the upper bound of the packet of rays which emanate from light source 701 and strike lens 706. 703b is the upper bound of the cone of rays focused by lens 706 from point 701 onto small area 701a on imager surface 708. Lines 704, 704a, and 704b denote the lower bound of the respective ray packets.

Figure 8:
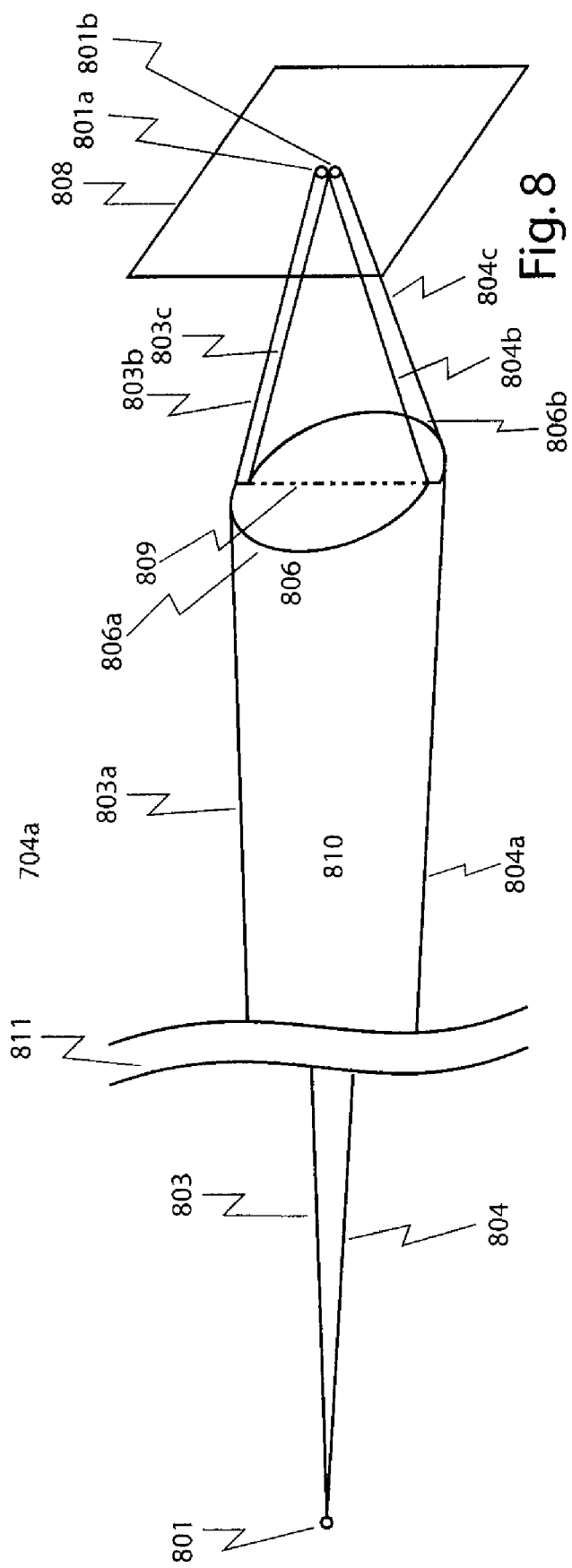
FIG. 8 depicts an embodiment of an imaging system.

FIG. 8 is similar to FIG. 7 except that lens 806 is divided along line 809 into sections 806a and 806b which are displaced slightly relative to each other as are elements of the lens depicted in FIG. 3. Thus, FIG. 8 is another way of looking at the lens system depicted in FIG. 3. Lens section 806a focuses the portion of the packet of rays from source 801 which strike it into a packet of rays having the general shape of half of a cone and having upper bound 803b and lower bound 804b. The light striking 806a is focused onto spot 801a of imaging plane 808. Likewise, lens section 806b focuses the portion of the packet of rays from source 801 which strike it into a packet of rays having the general shape of the other half of a cone and having upper bound 803c and lower bound 804c. The light striking 806b is focused onto spot 801b of imaging plane 808. For embodiments of the optical system for the camera of a headlamp camera control, it is preferable that FIGS. 7 through 10a and FIG. 27 be considered views from the top.

Figure 9:
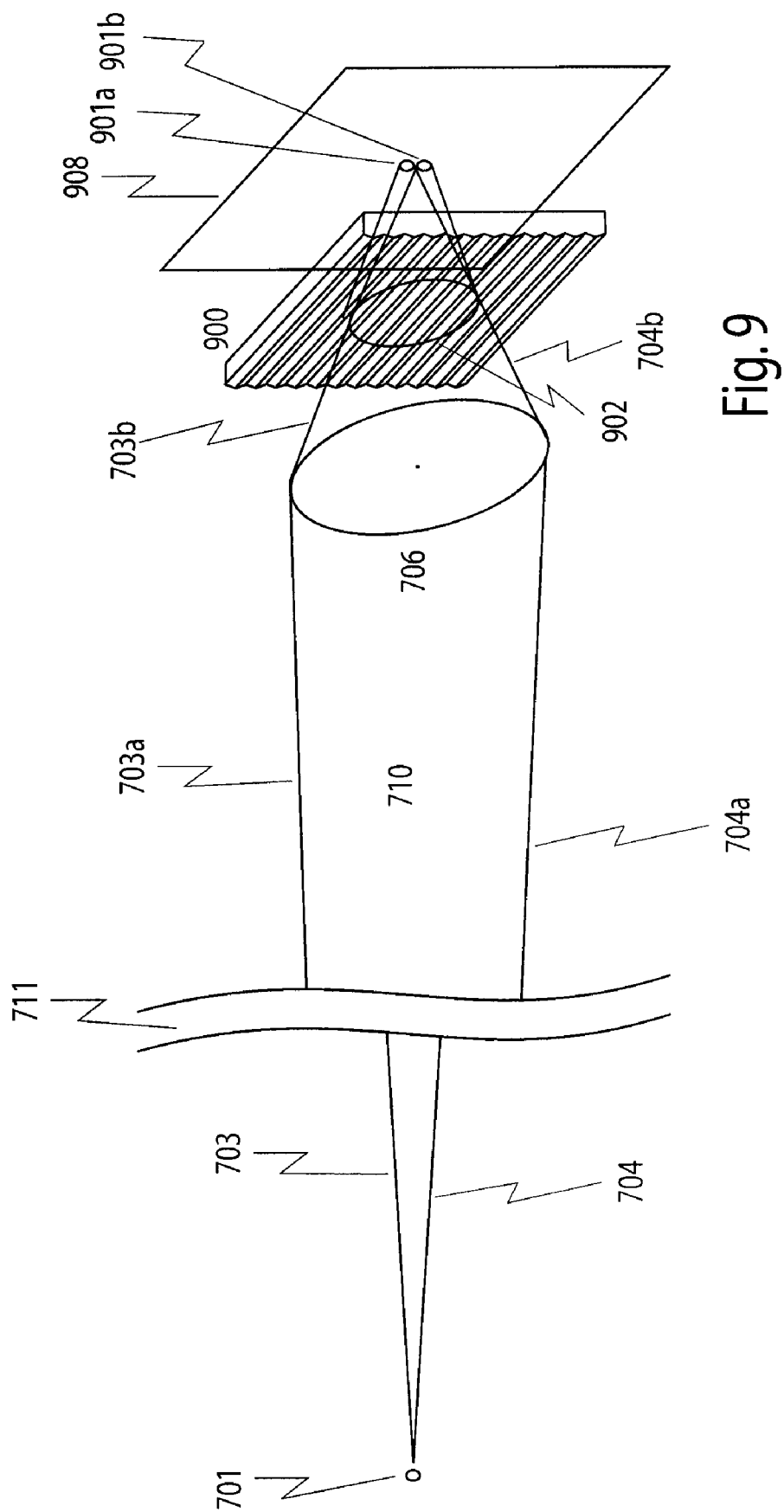
FIGS. 9 and 9a-9d depict various embodiments with details of optical structures.

Turning to FIG. 9, a second and generally preferred technique is used to split the lens image into multiple close spaced images. Lens element 900 has a multiplicity of prism surfaces which for the case of the double image assume one of two general angular orientations. The cone of light focused by lens 706 strikes the prism-covered surface of lens element 900 in circular area 902. Light in the focused cone, which passes through the set of prisms or lens facets with the first orientation, is deflected slightly in one direction and the light in the focused cone, which passes through a set of prisms or lens facets with the second orientation, is deflected slightly in another direction. The result is that instead of converging to a single spot as in FIG. 7, the rays passing through the prism surfaces with the first orientation are focused on spot 901a and the rays passing through the prism surfaces with the second orientation are focused on spot 901b. Prism surfaces of each orientation must be distributed uniformly so that for each orientation of source 701, and the resulting position of circle 902 on the surface of lens element 900, nearly equal areas for prism surfaces of each orientation are presented for rays in the focused packet to pass through. There must also be a sufficient number of repeats of the prism surfaces in the circle 902 illuminated by the cone of light so that nearly equal areas are still presented as the orientation of the circle 902 changes due to changes in the position of light source 701 in the scene.

Rays close to the periphery of the cone of rays which are focused by the lens and those which are close to the boundaries of the image will tend to strike the prisms at a greater angle and travel a greater distance to the imager. Because of nonlinearities in the angle of refraction versus the angle of incidence, the greater angle of incidence will tend to increase the resulting angle of refraction which will increase the displacement of the resulting image on the imager. The greater distance of travel will also increase the displacement of the image on the imager. As a design refinement, it may be useful to generally decrease the prism angles as the distance of the prism surfaces from the center of lens element 900 increases. Certainly, not every ray which strikes a given point on lens element 900 will have the same angle of incidence. As a result, the above consideration is one of best overall fit and not in general one of having rays of only one angle of incidence passing through each prism surface. The line of reasoning above may be extended to locally modify the surface angles of the prism facets so that the prism type lens facets are no longer planar.

A second approach may be used to reduce the variation in the area presented by the two sets of prism surfaces as the position of source 701 changes in the field of view. For example, trim the outline shape of lens 706 approximately to a square or rectangle so that the focused packet of rays assumes a pyramid shape rather than the circular conical shape. Then the illuminated area 902 on lens element 900 will become generally square or rectangular. The design of the prism pattern on lens element 900 may then be chosen such that an integral number of repeats of the prism pattern are illuminated in the square or rectangular area of illumination. With such a design, approximately equal areas for prisms of each orientation will be illuminated even as the position of point 701 and the resulting position of now square or rectangular area 902 change.

Figure 9A:
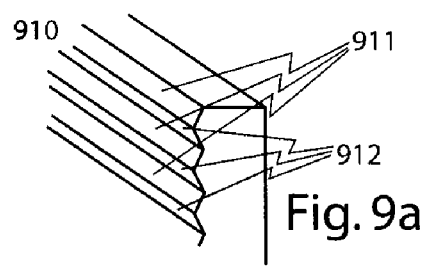
Figure 9B:
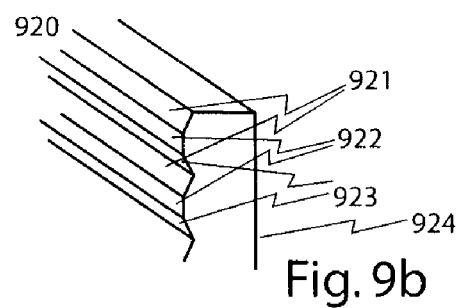

FIG. 9a depicts an enlarged corner 910 of lens element 900. A substantially flat set of first surfaces 911 assumes one angular orientation and a substantially flat set of surfaces 912 assumes a second angular orientation. FIG. 9b depicts an enlarged corner view of a prism array designed to project three in-line multiple images for use with a three-color spectral filter array such as the one depicted in FIG. 6. In this array, lens 920 has substantially flat surfaces 922 which do not significantly impact the direction of light rays passing through them and exiting through the back surface of the lens. Substantially flat prism surfaces 921 assume one angular orientation so that they refract rays which pass through them in one direction. Substantially flat prism surfaces 923 assume a second angular orientation so that they refract rays which pass through them in a second direction. Together, the three sets of surfaces will produce a linearly aligned triple image.

Figure 9C:
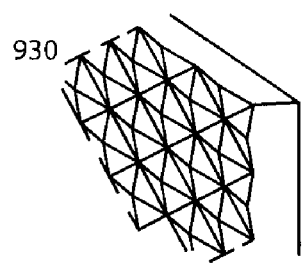
Figure 9D:
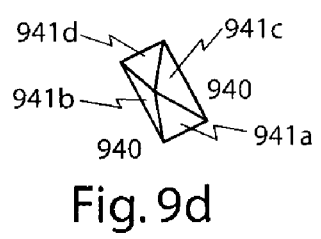

FIG. 9c depicts a lens 930 which is designed to produce a quadruple image in a square pattern for use with a Bayer type of color filter array such as the one depicted in the color filter array of FIG. 5. FIG. 9d shows a detail of the lens structure used for each of the lens facets which make up the lens structure 930. Pyramid-shaped structure 940 has four approximately planar sides, each of which serves as a prism. Side 941a refracts light up and to the left. Side 941b refracts light up and to the right. Side 941c refracts light down and to the left. Side 941d refracts light down and to the right. The pyramid 940 is oriented so that two of its edges are in the horizontal plane and the other two of its edges are in the vertical plane. In this way the centers of the four images form a square as indicated in FIG. 5. In all of the designs above, the angles of the prism elements must be chosen to yield the proper angle of refraction which also depends on the indices of refraction of the lens materials involved. The distance between refracted images also depends on the distance of the refracting lens from the imaging plane and also on any intervening optical elements. All of these factors must be properly accounted for in order to obtain the proper orientation and spacing of the images in the focal plane. Furthermore, localized adjustments may be made to minimize overall lens aberrations and to improve lens performance.

Figure 10:
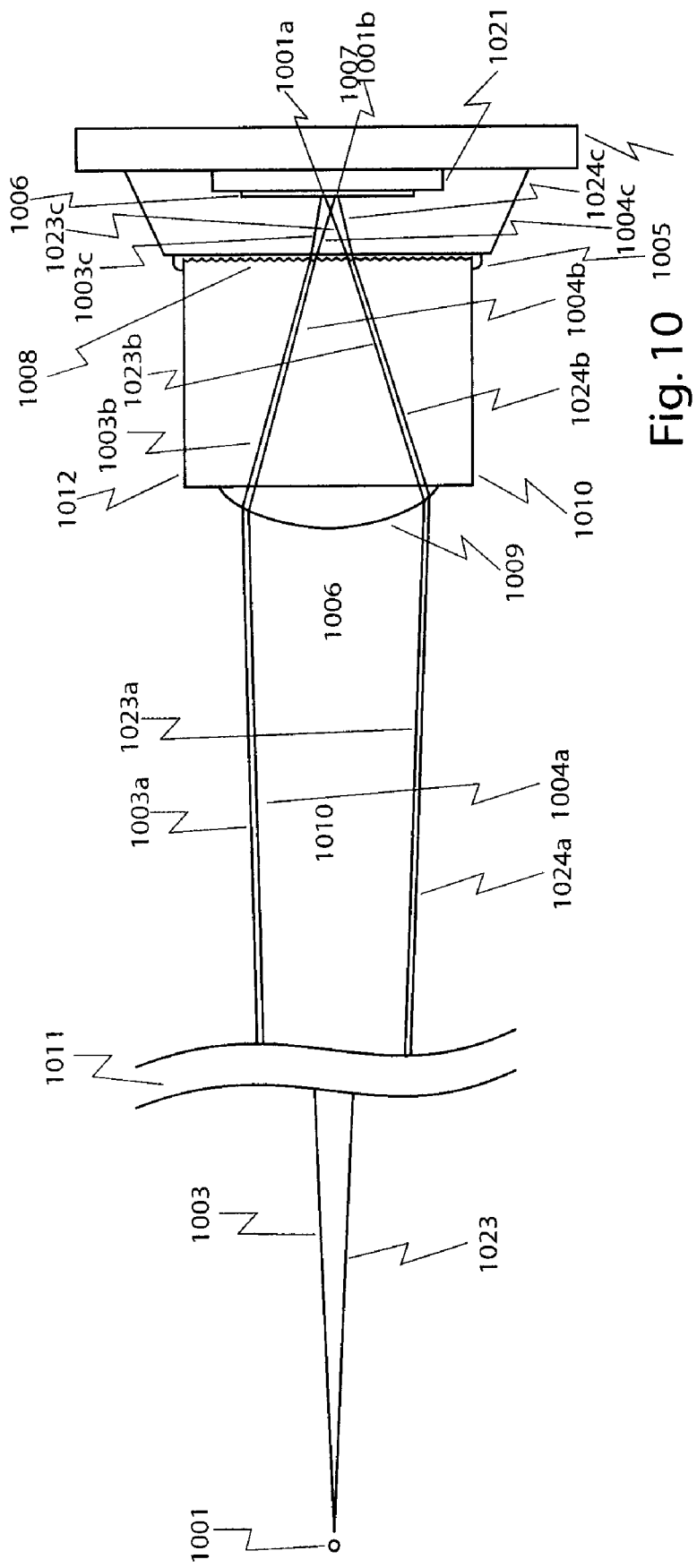
Figure 10A:
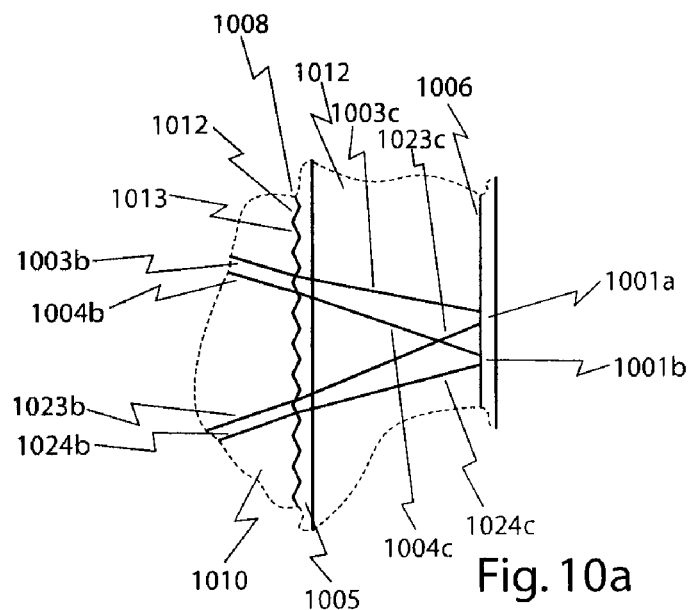

With reference now to FIG. 10, the optical system for a camera such as may be used in a headlamp dimmer application is depicted. Related FIG. 10a shows expanded detail around the lens 1008 which produces the double image. The general optical arrangement is similar to that of FIG. 9 except that the lens surface 1009 is on the exit side of lens block 1010 which has the higher index of refraction. The lens block 1010 includes the integrally molded imaging lens 1009 and the image splitting lens 1008. A CMOS silicon imager 1021, shown in edge view, has active pixel imaging surface 1006 and is mounted to circuit board 1007. In this embodiment, a two-color filter array is used. Other lens configurations could be substituted for image splitting lens 1008 to accommodate other filter array configurations. A transparent plastic block 1012 is molded around and encapsulates the silicon imaging chip. Loctite UV cure material 1005 is used to cement the lens block 1010 to the image encapsulating block 1012. The cement is applied in liquid form between the two pieces to be joined. To focus and position the lens, the imager may be energized and a test pattern may be projected onto it by the lens assembly. The lens is positioned to achieve desired position and focus of the test pattern on the imager surface. Ultraviolet rays are used to cure the epoxy. The refractive index of the epoxy is approximately 1.5 and the refractive indices of the polycarbonate block 1010 and of the transfer molded epoxy block 1012 are approximately 1.57 to 1.59. Thus, a weak lens is formed between lens surface 1008 and the Loctite epoxy 1005. A packet of rays indicated by 1003 on the top and 1023 on the bottom emanate from point 1001 in the scene. 1011 is a break to indicate the relatively large distance of the point 1001 from the camera assembly. Rays from 1001 which strike lens 1006 are focused toward a spot on the imager. A portion of these rays indicated by rays 1003a and 1023a passes through prism portions 1012 of splitting lens 1008 which slope upward and to the right and another portion of these rays indicated by 1004a and 1024a passes through portions 1013 of splitting lens 1008 which slope downward and to the right. The net result of the ray trace path for rays 1003b and 1023b is that they are refracted slightly in the upward direction as rays 1003c and 1023c. They strike the imaging surface 1006 at spot 1001a. Similarly, the net result of the ray trace path for rays 1004b and 1024b is that they are refracted slightly in a downward direction as rays 1004c and 1024c. They strike the imaging surface 1006 at spot 1001b. The ratio of the index of refraction of lens block 1000 to the index of refraction of the Loctite UV cure epoxy is, for example, approximately 1.06. This forms a relatively weak refracting lens surface. This is an advantage, since even with the relatively close space on the order of several millimeters from the lens 1008 to the imaging surface 1006 and a relatively coarse pitch of about 15 micrometers for the pixel spacing, the prism wedge angles should be in the range of one to ten degrees for the example as opposed to roughly one-tenth that for a polycarbonate to air lens placed in the same position. Other effects of the weak lens interface are that the effect of lens surface slope variations is also reduced being approximately proportional to the ratio of the indices of refraction on either side of the lens interface. These factors combine to make it much easier to produce a lens of the required quality. Furthermore, all of the other components except for the prism patterned lens surface 1008 were needed for a design without the lens splitting feature so it is anticipated that the required double image can be added with relatively minor tooling cost. Additionally, surface reflections are reduced by using lens interfaces between materials which have indices of refraction whose ratio is close to one since surface reflections are approximately equal to the square of this ratio. With other materials, the indices of refraction relative to one another may be different. For example, the index of refraction of the cement may be higher rather than lower than the index of the material in an adjoining optical part. The optical design can be adjusted to account for these differences and the principles of the present invention apply.

Figure 11:
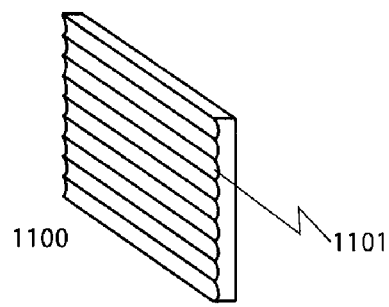
FIG. 11 depicts an embodiment of an optical element.
Figure 10:
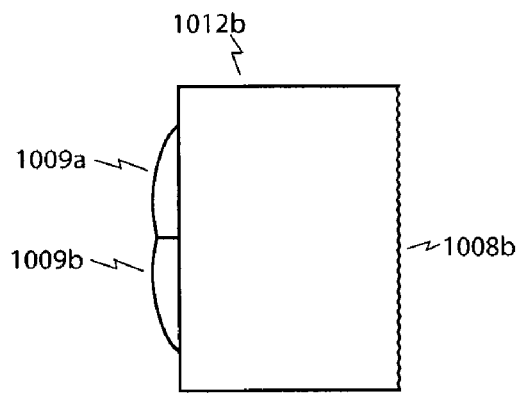

FIG. 11 depicts a lens 1100 which has multiple concave surfaces one of which is 1101. This lens may be used to replace lens 900 of FIG. 9. The cylindrical lenses introduce astigmatism into the optical system. This will not produce the multiple image, but with proper design, will elongate a spot pattern into an oval or a more or less straight-line blob. With the appropriate amount of astigmatism, the projected spot on the imager surface may be swept over a controlled distance to provide approximately equal coverage on two adjacent color patterns. Unlike the multiple image, the light will also be much more uniformly distributed over the pixel surfaces in the direction of the sweep, but it is preferable for the length of the sweep to be somewhat greater than the color filter array pattern spacing so that the swept length includes the widths of pixels to be blended. For example, if adjacent pixels are to be blended, the sweep length is preferably two pixel widths instead of the single pixel offset used for the multiple images. More resolution is likely to be lost than with the multiple image approach, but averaging over the pixel is improved and lens surface geometries may be such that wire EDM (electro discharge machining) may be used to fabricate the required molds. As with the multiple image solutions, it is also possible to exercise some control over directions in which resolution is preserved.

Convex surfaces may also be used and the small stripes should be sized in much the same fashion as the prism surfaces with the same general considerations of having enough repeats or of having lens geometries matched so that each portion of the cylindrical surface of each angular orientation receives approximately equal illumination. In this instance, each lens surface is, for example, designed to produce the desired amount or length of linear dispersion at the lens surface. As an option, a single generally cylindrical surface may be used in place of the multiple surfaces indicated. In this case, the lens outline may be squared or otherwise shaped to improve uniformity of the projected image along its sweep and the curvature may be adjusted to yield the desired degree of dispersion.

Figure 12A:
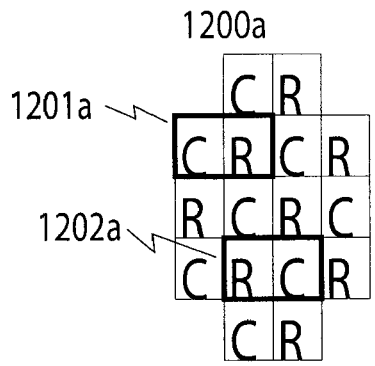
FIGS. 12a-12d depict various embodiments of spectral filter patterns.
Figure 12B:
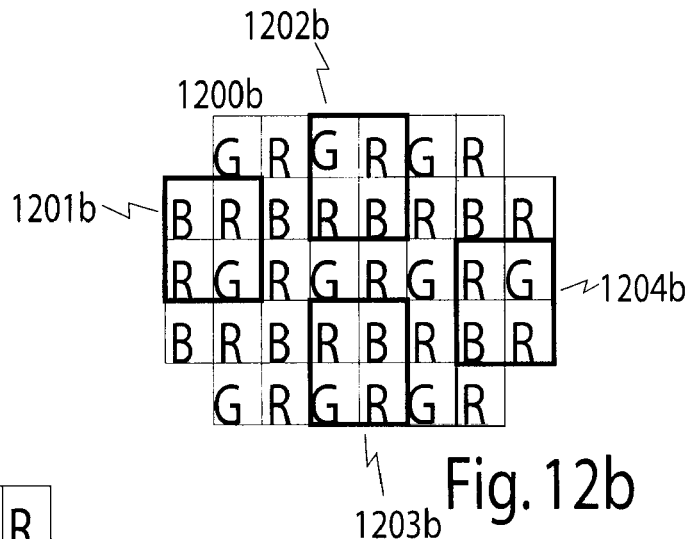
Figure 12C:
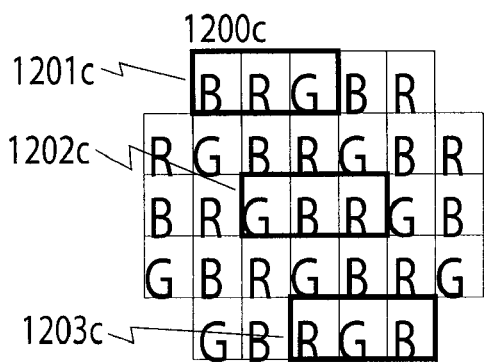
Figure 12D:
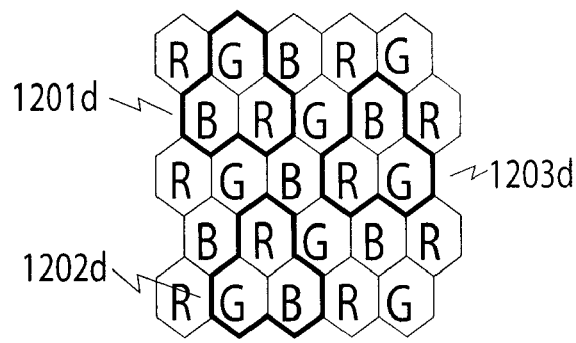
Figure 13:
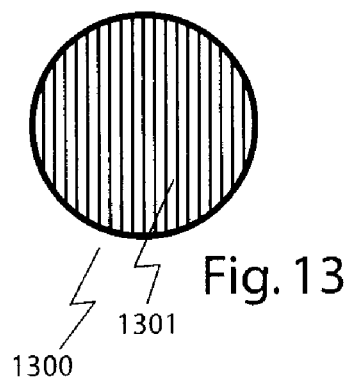
FIG. 13 depicts an embodiment of an optical element.

Turning now to FIGS. 12a-12d, a portion 1200a of an imager with a checkerboard pattern of red and clear pixels is shown. Boxes 1201a and 1202a each enclose a set of two pixels and either may be selected as a smallest unit array for the color filter array. There are also two vertically oriented smallest unit array configurations which may be chosen. In FIG. 12b, the imager 1200b has a modified Bayer pattern with two red pixels, one blue, and one green pixel in the unit group. Any one of the four square enclosed groups of pixels 1201b through 1204b may be chosen as a smallest unit array for the color filter array. In FIG. 12c, the imager 1200c has red, green, and blue color filters arranged as diagonal "stripes." Any one of the groups of pixels enclosed by rectangles 1201c through 1203c may be used as a smallest unit array. Three vertically arranged rows of three pixels may also be selected as smallest unit array for this color filter array. In FIG. 12d, an unusual honeycomb style pixel array is depicted. Any one of the three groups 1201d through 1203d may be selected as a smallest unit array. Three patterns with the single pixel on the bottom may also be selected as the smallest unit array for this sensor.

Figure 14:
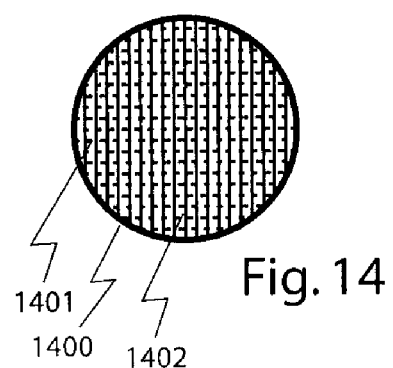
FIG. 14 depicts an embodiment of an optical element.
Figure 15:
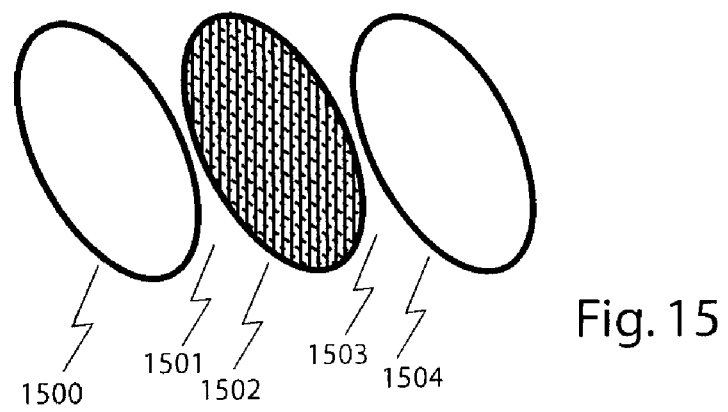
FIG. 15 depicts an embodiment of an optical assembly.
Figure 16:
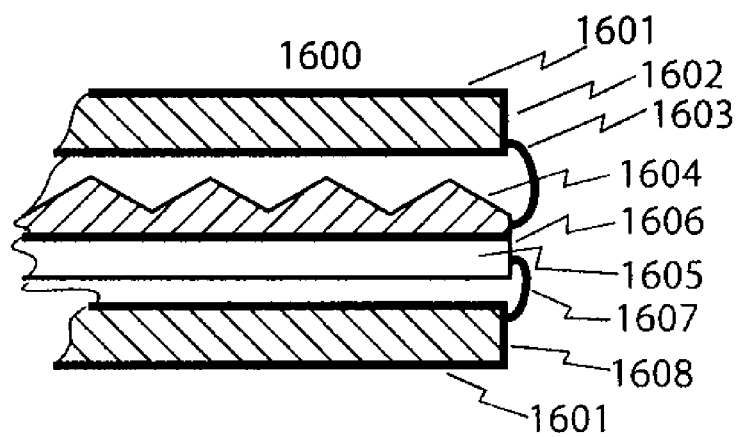
FIG. 16 depicts a profile view of an embodiment of an optical assembly.

Turning now to FIGS. 13-16, a lens 1300 has a surface 1301 having substantially the same prism pattern as lens 900 of FIG. 9, the difference being that the lens has been given a circular outline. The opposing surface of the lens of FIG. 13 may be flat. In FIG. 14, lens 1400 has the same vertically oriented prism pattern as the lens of FIG. 13 on its front surface. On its reverse side it has a similar prism pattern which is horizontally oriented. Focused light rays passing through the prism pattern on the front surface will be split into two horizontally aligned images as some rays pass through prisms having each of the two orientations on the front surface. Then, each of the two horizontally aligned images generated by the prism elements on the front surface will be broken into two vertically aligned images as they pass through the horizontally aligned prisms on the back surface. The resulting image is a quadruple image similar to that produced by the lens configuration depicted in FIGS. 9c and 9d. The single-sided pattern of FIGS. 9c and 9d could also be substituted for the two-sided lens pattern used on lens element 1502 and FIG. 15. In FIG. 15, lens element 1502 is preferably like that described in FIG. 14 and is preferably very thin and molded of plastic. Elements 1500 and 1504 may be either glass lenses designed so that they may be cemented together or may be flat optical quality glass or plastic windows. In the invention, it is certainly possible to use other transparent lens materials such as quartz or sapphire. The windows, lenses, and/or lens coatings may perform filtering functions and the higher index ratio lens interfaces preferably have anti-reflection coatings. Lens cement is placed in the space 1501 between front element 1500 and splitting lens 1502 and in the space 1503 between splitting lens 1502 and rear lens, lens element 1504. The three window and/or lens elements are sandwiched together and the cement is cured. The lens elements may be adjusted to conform to non-planar surfaces such as the surface of a spherical or an aspherical lens element. In FIG. 16, a side view of the assembled elements from FIG. 15 is shown as assembled element 1600. Windows or lens elements 1602 and 1608 preferably have anti-reflection coated surfaces 1601. Where horizontal or vertical have been used, it is often to describe the specific figure including the orientation of one pattern relative to another. Other patterns with different or rotated orientations are within the scope of the present invention. Center element 1606 has vertically oriented prism elements 1604 shown in outline view and horizontally oriented prism elements 1605 shown in side view. Cement layers 1603 and 1607 secure the unit together. It is advantageous to have good spectral tracking over the spectrum with a mild difference in the index of refraction of the cement versus the center lens 1605 so as to form a relatively weak but colored neutral lens over the range of color for which the lens will be used.

Figure 17:
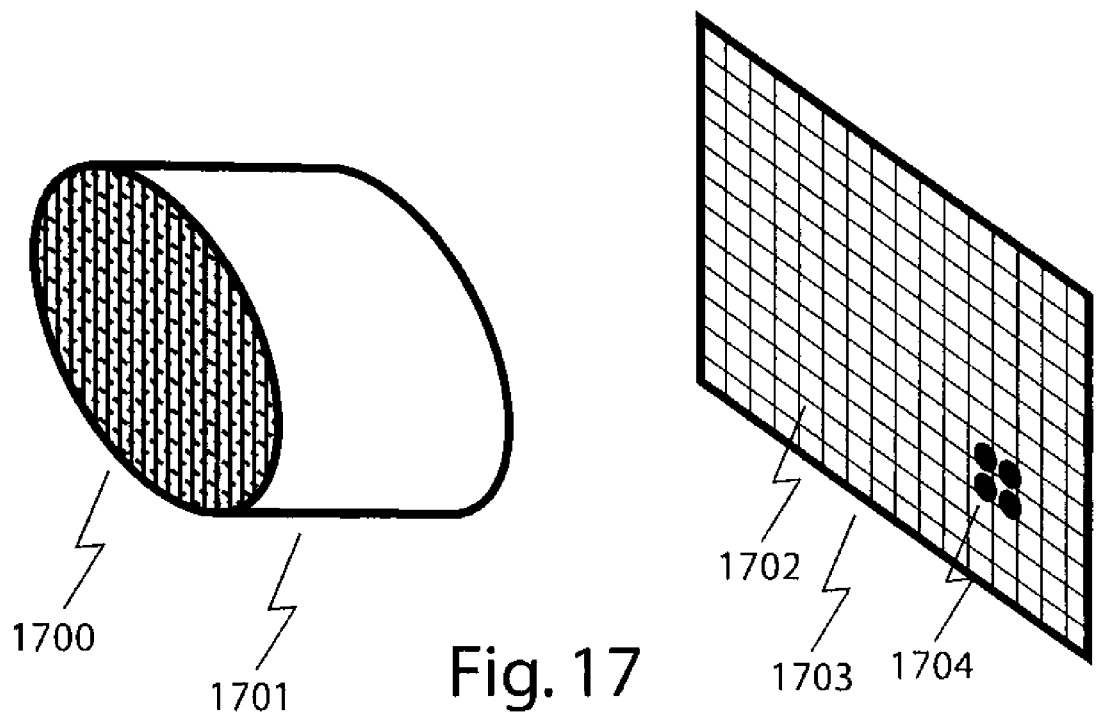
FIG. 17 depicts a perspective view of an embodiment of an imaging system.

With reference now to FIG. 17, a filter assembly 1700 preferably of the type described in FIGS. 13 through 16 is placed in front of lens 1701. Lens 1701 projects an image on a pixel array 1703 having rows and columns of pixels 1702. The optical materials and prism angles are chosen such that a point in the scene is projected as four spots 1704 which are spaced in a square pattern with approximately one pixel width spacing between the centers of the spots.

Potentially a filter may be selected from an array of filters having an assortment of prism angles from which the one having the desired multiple image pattern and or spacing may be chosen. The limitation is that the spacing of the points in group 1704 will change with the zoom setting of a zoom lens and even with the focus setting of the lens. The rotational orientation of the filter must also be correctly adjusted.

Figure 18:
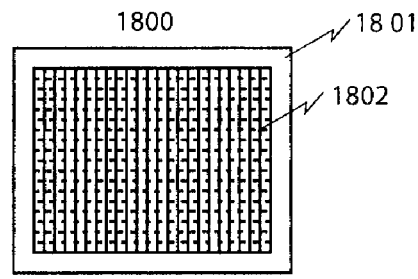
FIG. 18 depicts a plan view of an imaging system.
Figure 19:
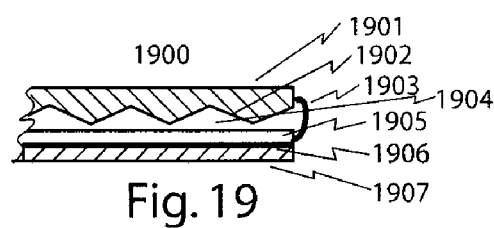
FIG. 19 depicts a profile view of an embodiment of an optical assembly.

Turning now to FIGS. 18 and 19, filter 1800 includes filter member 1802 which is mounted in frame 1801. This filter is an alternate construction designed to perform the general anti-aliasing functions described in previous figures. In a preferred configuration, filter member 1802 is constructed as shown in FIG. 19. In the fragmentary view of FIG. 19, filter 1900 is comprised of transparent members 1901 and 1907 which are joined by transparent cement layer 1905. Layer 1901 has prism surfaces 1902 shown in edge view and layer 1907 has prism surfaces 1905 shown in side view. The cement layer 1905 fills the space 1904 between the two transparent members and fastens them together. As in the previous examples, the cement is chosen preferably with a mildly different index of refraction than members 1901 and 1907 so that weak lenses are formed at the cement to member surface interfaces. The longitudinal orientations of the prism surfaces on members 1901 and 1907 are generally perpendicular to each other. Members 1901 and 1907 may be made from the same material with the prism surfaces placed at the perpendicular orientation as shown. The parts may be formed by extrusion, by molding, by pressing or by any number of fabrication methods. The filter 1802 may be supported and even stretched in frame 1801. Thus, the filter element may be made very thin. This is an advantage in optical systems, since thicker optical elements even with flat surfaces may alter and often degrade the performance of the lens, particularly by increasing color aberration.

Figure 20:
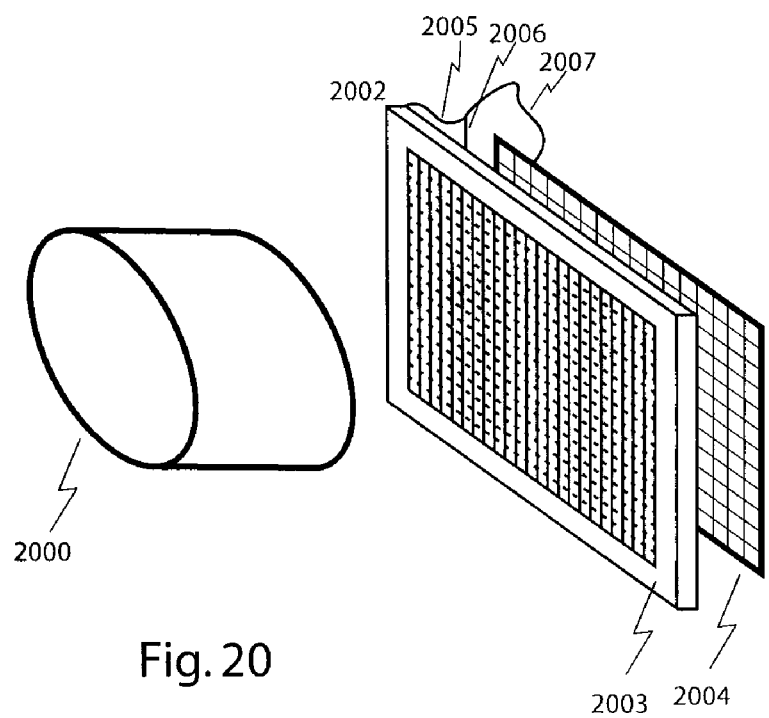
FIG. 20 depicts a perspective view of an imaging system.

Turning now to FIG. 20, a filter 2002 constructed as described in FIGS. 18 and 19 is depicted in a camera application. The filter is designed to be placed between a lens assembly 2000 and the imaging array 2004 at a specific distance from the imaging array. For example, in a single lens reflex camera, the filter 2002 may be designed to be placed just in front of or be designed to be placed just in back of the mirror which swings down to direct the image to the viewing screen of the camera. An enclosure shown in fragmentary view as surfaces 2005 and 2007 joined at edge 2006 may be included to seal the area including the imager back of the filter to protect it from dust and other contamination. The filter might even be incorporated as the active surface in a dust removal system such as the ultrasonically vibrated surface used in the new Olympus E-1 digital SLR camera. The outer surfaces of the filter should be coated with anti-reflection coatings as with other transparent material to air surfaces in an optical system. Since the filter can potentially be mass-produced at a low cost, it may also be made replaceable so that if damage is incurred, it may be replaced at a reasonable cost.

Figure 21:
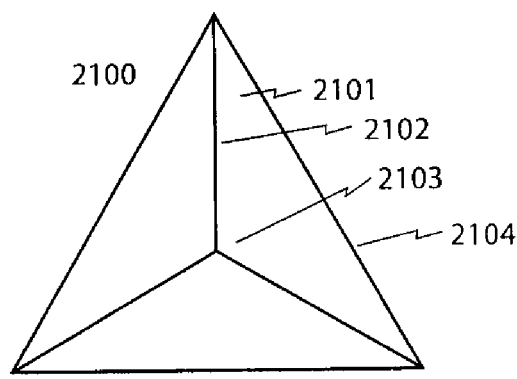
FIG. 21 depicts a plan view of an embodiment of an optical element.
Figure 22:
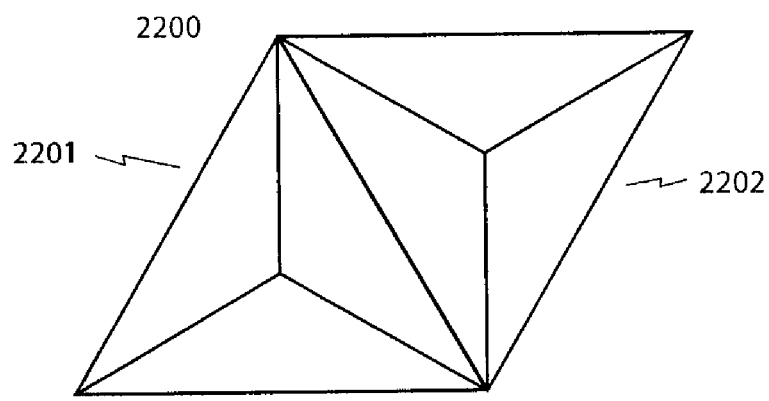
FIG. 22 depicts a plan view of an embodiment of an optical element.
Figure 23:
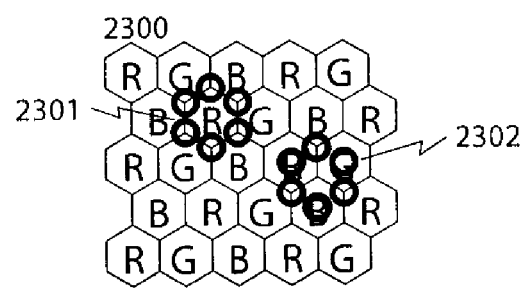
FIG. 23 depicts a plan view of an embodiment of a spectral filter pattern.
Figure 24:
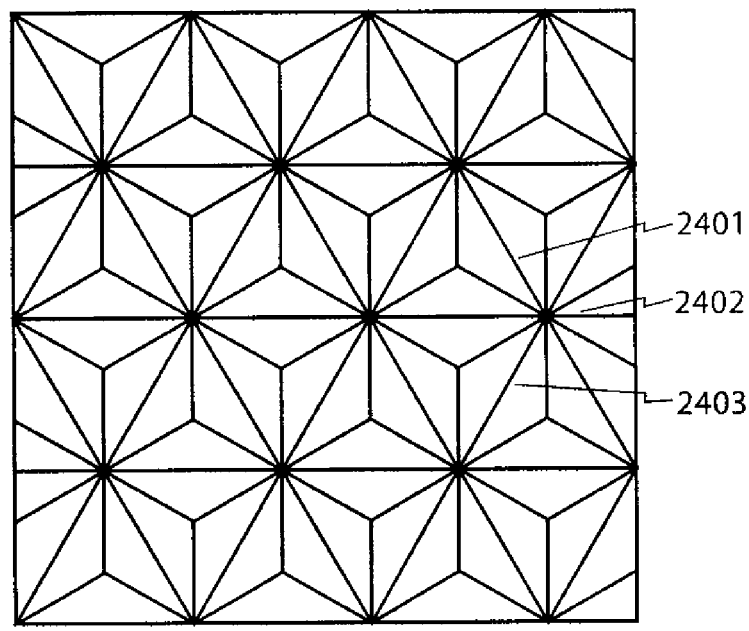
FIGS. 24 and 24a depict plan views of embodiments of optical elements.
Figure 25:
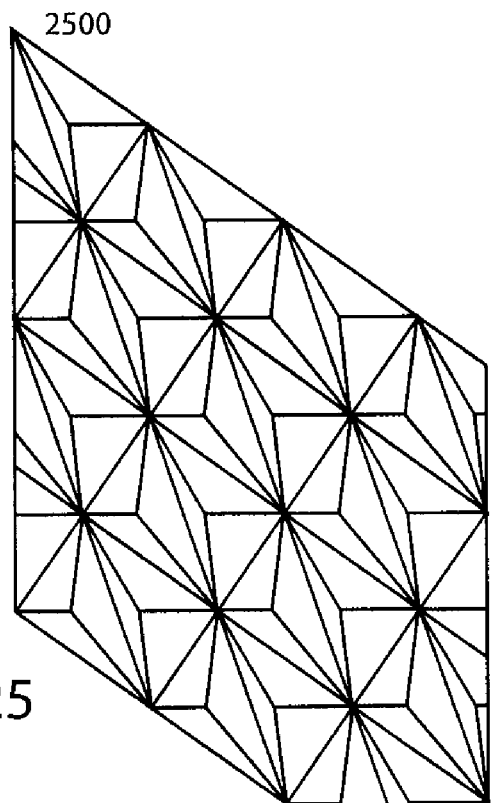
FIGS. 25 and 25a depict perspective views of embodiments of optical elements.
Figure 25A:
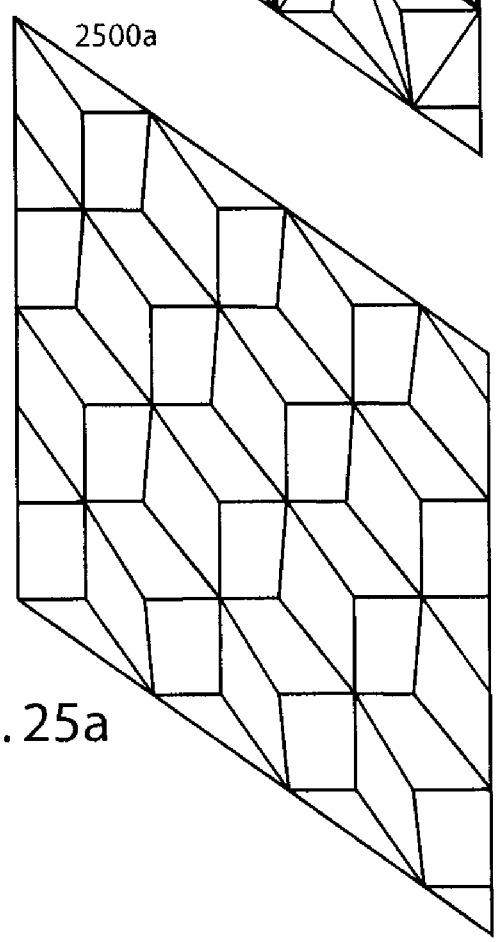

With reference to FIGS. 21 through 25a, components for an unusual imager in which the pixels are in an array for which the smallest unit array is a set of red, green and blue filtered pixels whose centers fall on the vertices of an equilateral triangle depicted. The most convenient lens configuration to create a triple image is the triangular pyramid shown in FIG. 21. The pyramid 2100 has a triangular base 2104, three sides of which 2101 is representative joined by three edges of which 2102 is representative, and a common vertex 2103. The problem is that triangular pyramids oriented as depicted in FIG. 21 cannot be nested together in a tight pattern without alternating orientation as depicted in FIG. 22. In FIG. 24, prismatic lens array 2400 is the step and repeat of the dual pyramid of FIG. 22. This surface can be machined by machining grooves along parallel paths having the three directions parallel to line 2401 or line 2402 or line 2403. In FIG. 25, the lens array 2400 is shown in an isometric view as lens array 2500. The lens array depicted in FIGS. 24 and 25 may be designed as a replacement for lens 900 in FIG. 9 to project the six-image multiple image depicted by image groups 2301 and 2302 in FIG. 23 onto imaging plane 908 of FIG. 9. The prism sizes are adjusted such that approximately equal areas of each of the six sets of similarly oriented surfaces receive approximately equal illumination from the area 902 of FIG. 9 which is illuminated by the projected cone of rays from a point in the scene. The angles of the triangular-shaped lens facets should then be adjusted so that the spacing between the centers of alternate spots, which are projected on the imaging screen 902, should approximately equal the center distance between adjacent pixels in the triangular array. Inspection of the multiple image groups 2301 and 2302 in FIG. 23 suggests that the six multiple images have the required property to project the image on equal and corresponding areas of pixels having each of the color patterns in a color array.

Figure 24A:
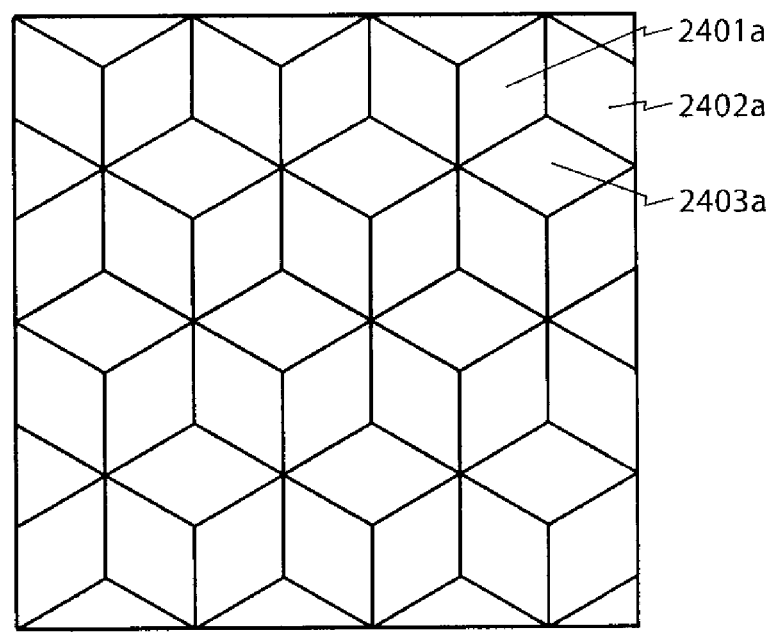

FIG. 24*a* is made up of units represented by the one having diamond-shaped sides 2401*a*, 2402*a*, and 2403*a*. The outline in the top view is hexagonal and the parts do nest together as required but the bases are not planar so more elaborate methods may be required to fabricate the required mold. The structure yields the desired triple image and is shown in isometric view as element 2500*a* in FIG. 25*a*. This lens may be substituted in FIG. 9 and adjusted by the same general steps described above except that there are three rather than six similarly oriented facets to illuminate, and the facet angles should be adjusted so that the distances between the centers of adjacent rather than alternate spots should be approximately equal to the distances between adjacent pixels in the triangular pixel sensor array.

As described, in at least one embodiment, at least one lens is configured such that light rays associated with a scene are directed through a lens element to result in at least two spatially dispersed images being projected upon an image plane of an image sensor. Each image comprises at least two segments that are vertically misaligned, horizontally misaligned or both vertically and horizontally misaligned. In at least one embodiment, at least three spatially dispersed images are projected upon an image plane of an image sensor. In at least one embodiment, at least four spatially dispersed images are projected upon an image plane of an image sensor. It should be understood that a lens itself may be configured to produce the multiple images.

The light rays associated with each scene are directed through a lens element to result in at least two images that are spatially interdispersed, such that a portion of the image falls on a pixel associated with one color, while the replica potion of the image falls on another pixel associated with another color, according to one embodiment. Thus, the images can overlap, and are interdispersed, while the spots of the replica images can be separated by the approximate spacing of the pixels. Also, the spots of the images can be vertically and, or, horizontally misaligned as a function of the at least one lens (e.g., FIGS. 9A-9D), such that the spots are off a vertical and, or, horizontal axis with respect to one another.

Figure 26:
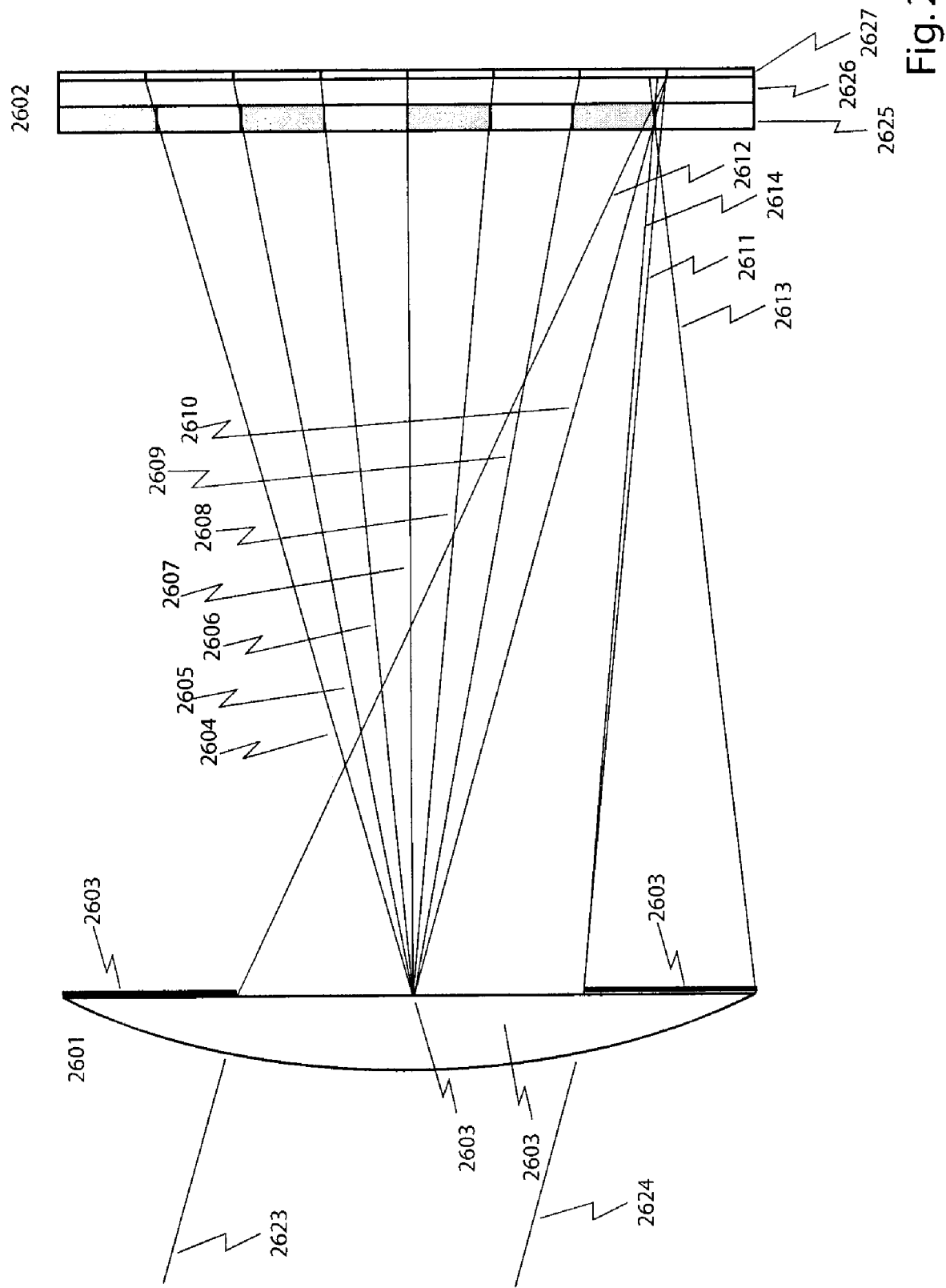
FIGS. 26 and 26a depict profile views of an imaging system.
Figure 27:
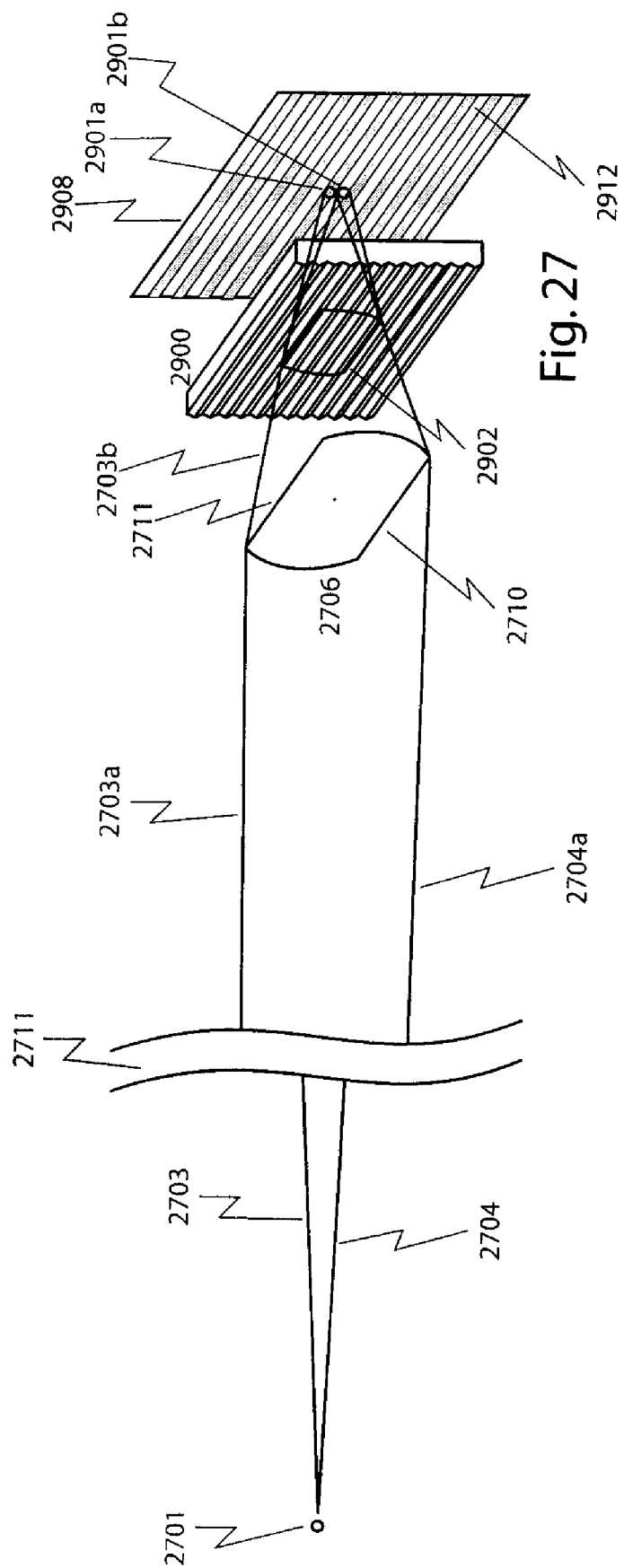
FIG. 27 depicts a perspective view of an imaging system.

The apparatus depicted in FIG. 27 is similar to FIG. 9 and contains changes to improve performance in the headlamp dimmer application. First, on the imaging surface 2908, a striped color filter array pattern has been used. As will be discussed further in FIG. 26, there is substantial spacing of the pigmented areas from the silicon sensing sites so that parallax errors for light passing through the color patches and striking the associated silicon pixel area are significant. By using the striped pattern, half of the pixel boundaries are of a common color reducing the source of this error by approximately 50%. The method also makes it possible to use a non-circular aperture for the lens to reduce off-axis angles in the direction where parallax is still a problem, further reducing the errors caused by parallax. The lens 2706 and/or an associated aperture has been sized or truncated to reduce the angular span of rays in a plane which is perpendicular to the stripes in the color filter array in order to selectively reduce the amount of light which passes through the filter stripes of one color and falls on the pixel areas for a differing color. The wider aperture in a direction parallel to the spectral filter stripe helps to maintain the needed optical gain of the camera. It is also preferable that, for each of the color filter patterns, there is substantial attenuation of the light in the pass band of the other filter colors in the array. Specifically, with a two-color array, it is preferable to use red and cyan rather than red and clear filter arrays. Three or more colors may optionally be used for the color filter array by choosing color filter stripes of colors which cyclically sequence through each of the colors for successive adjacent stripes in the filter array.

In detail, a packet of light rays bounded by rays 2703 and 2704 emanates from point 2701 in the scene. Break 2711 indicates the relatively large distance of point 2701 from the camera assembly. Packet bounding rays 2703 and 2704 continue as rays 2703*a* and 2704*a*. The packet of rays strikes the lens 2706 and is focused toward an image on the sensing surface of sensor 2908. Lens 2900 splits the image into a double image and is designed so that the spots 2901*a* and 2901*b*, which are images of point 2701 in the scene, have a center spacing approximately equal to the spacing between the centers of the filter arrays on adjacent rows of pixels. The offset of the corresponding spots in the multiple image should be approximately normal to the filter stripes and the associated rows of pixels. For more than two colors, there should be the same or a multiple of the same number of multiple images as there are distinct color filters in the selected smallest unit array of filters. The cylindrical lens array of FIG. 11 may optionally be used in place of the prism array 2900. In general, for n pixels in the unit array and n sets of filter stripes, it is preferable for the cylindrical lens array to fan the spot over n+1 pixel widths in a direction generally normal to the long direction of the filter stripes. The filter stripes are preferably registered to align with pixel boundaries as defined by rays projected through the approximate optical center of the lens rather than by the traditional normal alignment.

Figure 26A:
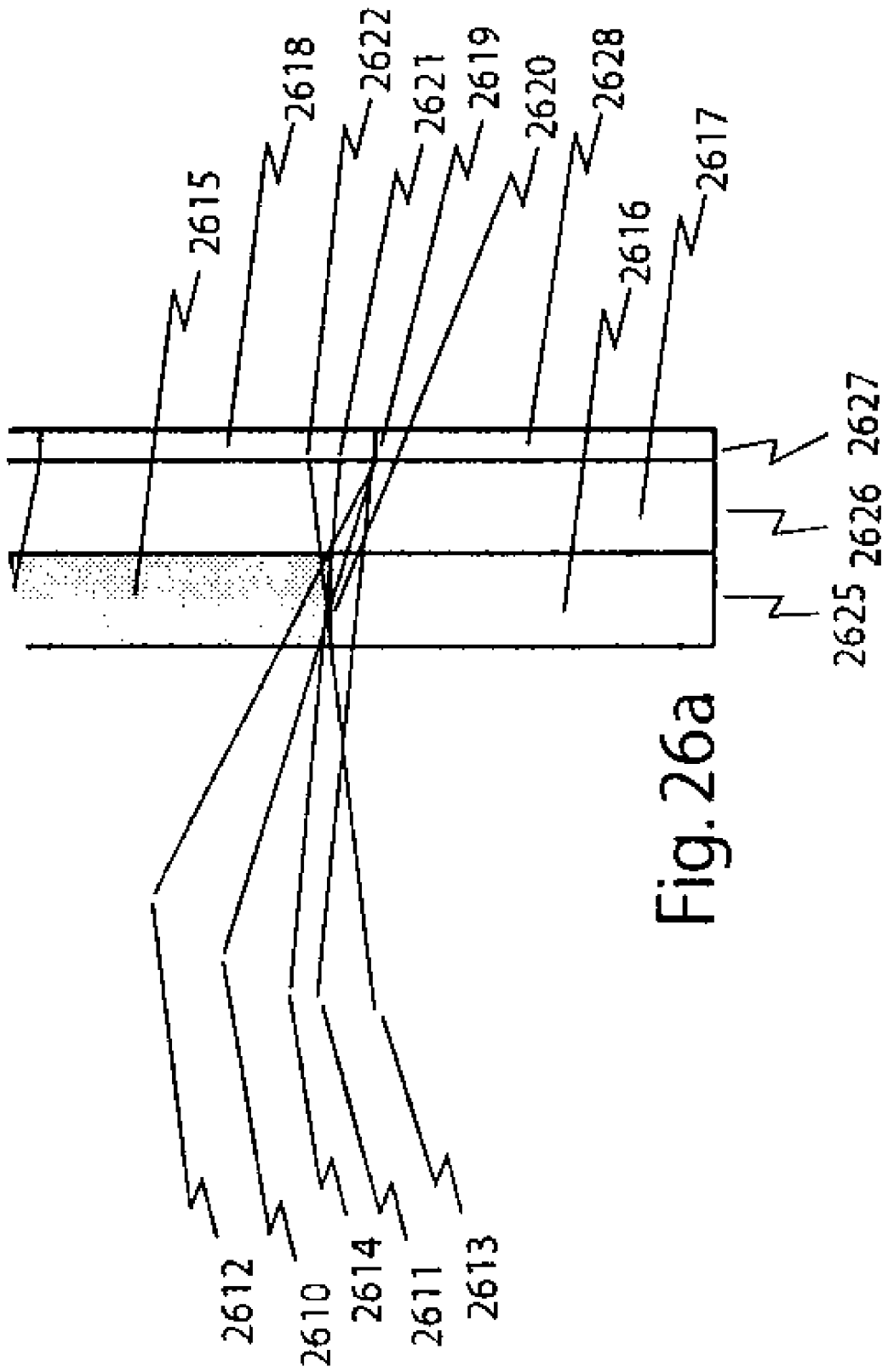

Turning to FIG. 26, a lens assembly 2601 is configured to focus light rays on an imager 2602 which has an associated color spectral filter array. Details of the lower portion of imager 2602 are shown in an enlarged view in FIG. 26*a*. All of the references for this expanded view, which are shown on FIG. 26, are repeated on FIG. 26*a* and additional references dealing with finer detail are also included in FIG. 26*a*. A light packet bounded by light rays 2623 and 2624 impinges on lens 2603 and is focused to spot 2619 at the boundary between pixel 2618 and pixel 2628. Three of the rays in the column of rays focusing on spot 2619 are shown and these include the two bounding rays 2611 and 2612 and the ray 2610 which is at the center of the cone of focused rays.

The imaging assembly 2602 includes the column of pixels 2627, a passivating layer 2626 and a column of color filters 2625. The combined thicknesses of the passivating layer 2626, possibly additional metal and insulating layer(s) and the filter layer 2625 may easily range from a quarter to more than equal to the width of the underlying pixels. Rays 2604 through 2610 are shown emanating from the center 2603 of the lens to each of the pixel boundaries. Better color accuracy is obtained by positioning the color filter ray boundaries so that they intersect or nearly intersect these lines rather than aligning them along the perpendicular to the pixel boundaries. Aperture plate 2603 has been optionally included in the lens assembly to restrict the angle between center ray 2600 and bounding rays 2611 and 2612. The effect may also be obtained by trimming the periphery of the lens as depicted for lens 2711 in FIG. 27. Ray 2614 is shown emanating from the lower edge of the restricted lens aperture and passing through the boundary between color filters 2615 and 2616. This ray strikes the imager at 2621 and the segment of the imager between its boundary at 2619 and the horizontal plane through the point 2621 will be illuminated by light passing through the wrong filter 2616. If the aperture plates 2603 are removed, ray 2613 from the lower periphery of the lens to the boundary between pixel 2615 and pixel 2616 strikes the imaging surface at point 2622. In this case, light of the wrong color encroaches almost twice as far onto the surface of pixel 2618. The aperture plates 2603 restrict the amount of light reaching the imager, but the lens can be narrowed significantly before there is a dramatic reduction in the light collecting area. A good compromise is to shape the lens approximately as shown in FIG. 27 and to make the diameter slightly larger than it would otherwise have been made to offset the reduction in an area due to trimming of the sides.

Figure 28:
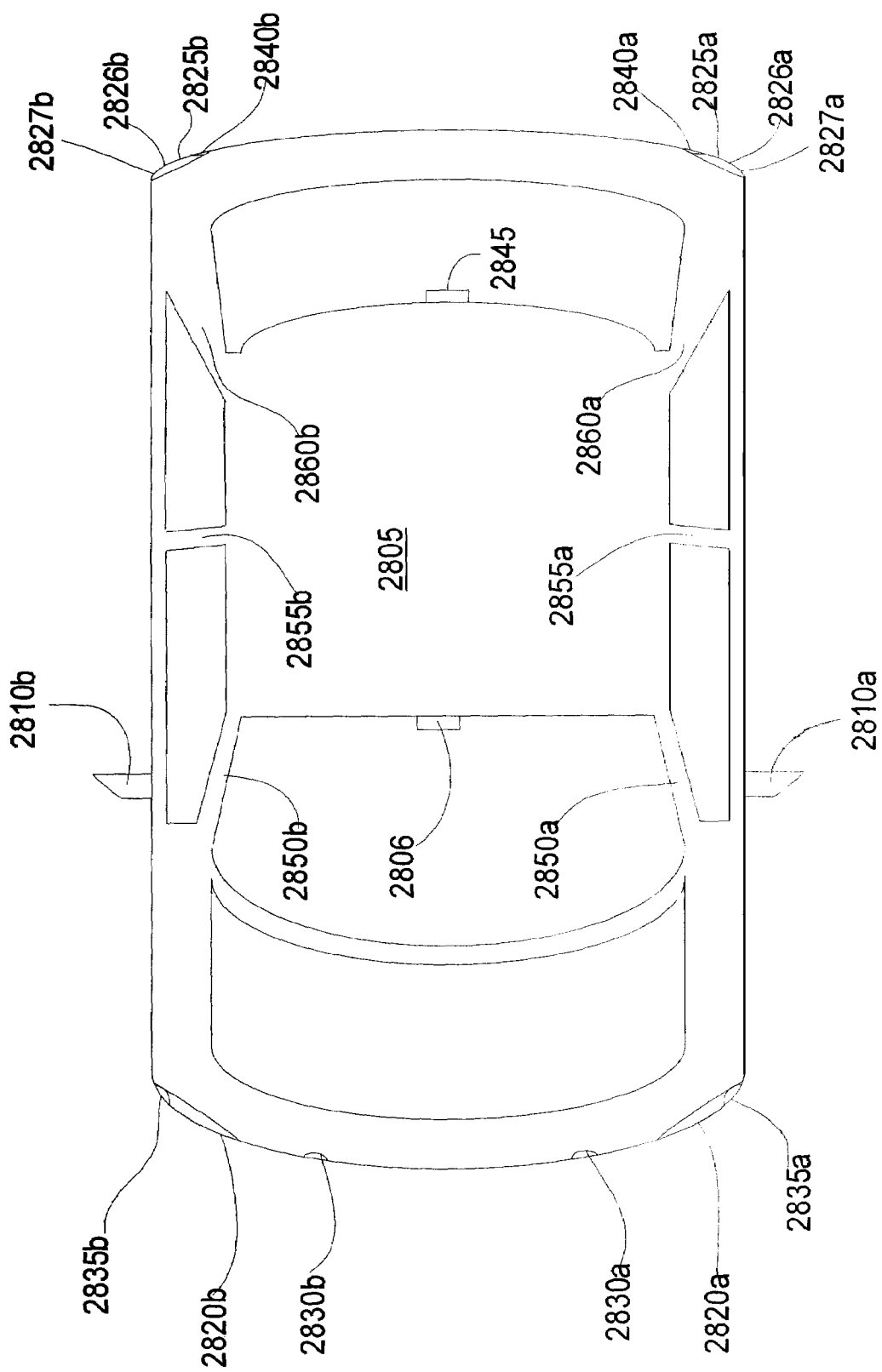
FIG. 28 depicts a vehicle comprising various vehicle systems.

FIG. 28 depicts a controlled vehicle 2805 comprising an interior rearview mirror assembly 2806 incorporating an automatic vehicle exterior light control system. The processing and control system functions to send configuration data to the imager, receive image data from the imager, process the images and generate exterior light control signals. Detailed descriptions of such automatic vehicle exterior light control systems are contained in commonly assigned U.S. Pat. Nos. 5,837,994, 5,990,469, 6,008,486, 6,130,448, 6,130,421, 6,049,171, 6,465,963, 6,403,942, 6,587,573, 6,611,610, 6,621,616, 6,631,316, 6,774,988, and 6,861,809; and U.S. patent application Ser. Nos. 10/645,801, 10/615,317, 10/783,131, and 10/777,468, the disclosures of which are incorporated herein in their entireties by reference. The controlled vehicle is also depicted to include a driver's side outside rearview mirror assembly 2810*a*; a passenger's side outside rearview mirror assembly 2810*b*; a center high-mounted stop light (CHMSL) 2845; A-pillars 2850*a*, 2850*b*; B-pillars 2855*a*, 2855*b*; and C-pillars 2860*a*, 2860*b*, it should be understood that any of these locations may provide alternate locations for an image sensor, image sensors or related processing and/or control components. It should be understood that any, or all, of the rearview mirrors may be automatic dimming electro-optic mirrors. The controlled vehicle is depicted to include a host of exterior lights including headlights 2820*a*, 2820*b*; foul weather lights 2830*a*, 2830*b*; front turn indicator/hazard lights 2835*a*, 2835*b*; tail lights 2825*a*, 2825*b*; rear turn indicator lights 2826*a*, 2826*b*; rear hazard lights 2827*a*, 2827*b* and backup lights 2840*a*, 2840*b*. It should be understood that additional exterior lights may be provided, such as separate low beam and high beam headlights, integrated lights that comprise multipurpose lighting, etc. It should also be understood that any of the exterior lights may be provided with positioners (not shown) to adjust the associated optical axis of the given exterior light. It should be understood that the controlled vehicle of FIG. 28 is generally for illustrative purposes and that suitable automatic vehicle exterior light control systems, such as those disclosed in the patents and patent applications incorporated herein by reference, may be employed along with other features described herein and within disclosures incorporated herein by reference.

Figure 29:
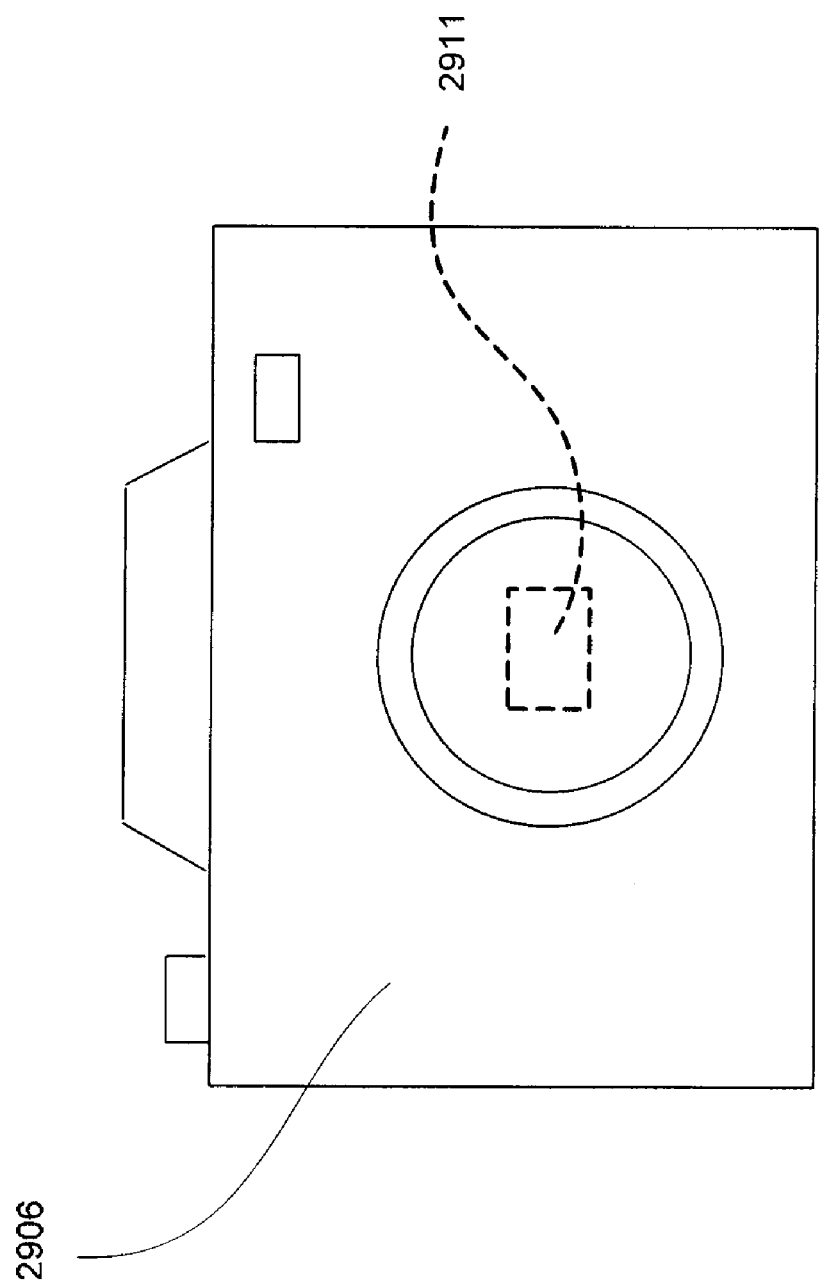
FIG. 29 depicts a digital camera comprising improved color rendering optics.

FIG. 29 depicts a profile view of a digital camera 2906 having an imager with lens 2911 and/or a lens element in accordance with the present invention. It should be understood that optics in accordance with the present invention may be incorporated into a host of assemblies included, but not limited to, light sensing, light sources, illuminators, indicators, emitters, signals, moisture sensing, rear-vision systems, lane departure detection systems, adaptive cruise control, occupancy detection systems, security systems, vision systems, color measurement, head lamp control, variable reflectance rearview mirror control, digital video recorders and digital cameras.

It should be understood that the above descriptions are for illustrative purposes and that the scope of the present invention is not limited thereby. The scope of the present invention shall be construed to encompass all equivalent structures and functions as the embodiments described herein.

What is claimed is:

1. A vehicle system, comprising:
   at least one lens configured for light sensing applications and further configured to project two or more spatially interdispersed images of a scene upon an image plane of an image sensor, wherein said two or more spatially interdispersed images are configured as a function of a patterned spectral filter positioned between said lens and said image sensor and wherein said at least two spatially interdispersed images are vertically and, or, horizontally misaligned with respect to one another, and each of said spatially interdispersed images pass through a different color of said spectral filter to fall on a pixel array, such that alternate spots of said spatially interdispersed images fall on like portions of said pixel array except that said colors of said spectral filter are reversed.

2. A vehicle system as in claim 1, wherein said spectral filter defines one of a group of patterns comprising: a checkerboard pattern, an RGB pattern, a Bayer pattern and a striped pattern.

3. A vehicle system as in claim 1, wherein said spectral filter comprises at least one color selected from a group comprising: red, cyan, blue, green, blue-green, amber, infrared and ultra violet.

4. A vehicle system as in claim 1, wherein said lens is configured to split a first image into three or more spatially interdispersed images.

5. A vehicle system as in claim 1, wherein said lens is configured to split a first image into four or more spatially interdispersed images.

6. A vehicle system as in claim 1, wherein said spatially interdispersed images are linearly aligned.

7. A vehicle system as in claim 1, wherein said spatially interdispersed images define a checkerboard pattern with respect to one another.

8. A vehicle system as in claim 1, wherein said at least two spatially interdispersed images are both vertically and horizontally misaligned with respect to one another.

9. A vehicle system as in claim 1, wherein centers of said at least two spatially interdispersed images are both vertically and horizontally misaligned with respect to one another.

10. A vehicle system as in claim 1, wherein centers of said at least two spatially interdispersed images are vertically and, or, horizontally misaligned with respect to one another.

11. The vehicle system as in claim 1, wherein said spatially interdispersed images each comprise a spot, such that said at least one lens spatially interdisperses said images so that said spots are vertically and, or, horizontally misaligned.

12. The vehicle system as in claim 1, wherein the vehicle system is controlled based upon said two or more spatially interdispersed images.

13. The vehicle system as in claim 1, wherein due to pattern matching of multiple interdispersed images, a non-uniformity in illumination over individual pixels approximately matches for corresponding pixels of various colors so that a ratio of a response to said different colors is substantially accurate even when an absolute response is inaccurate due to a non-uniformity in a response of said pixel over its area.

14. A vehicle system, comprising:
   at least one lens configured for light sensing applications and further configured to project first oriented light rays associated with a scene to form two or more spatially dispersed images of the scene on an image plane of an image sensor, wherein a portion of said two or more spatially dispersed images overlap one another, and a portion of said two or more spatially dispersed images that are not overlapping pass through a different color of said spectral filter to fall on a pixel array, such that alternate spots of said spatially dispersed images fall on like portions of said pixel array except that said colors of said spectral filter are reversed.

15. A vehicle system as in claim 14, wherein said image sensor comprises an array of pixels.

16. A vehicle system as in claim 15, wherein at least one patterned spectral filter is positioned between said lens and said image sensor.

17. A vehicle system as in claim 16, wherein said patterned spectral filter defines one of a group of patterns comprising: a checkerboard pattern, an RGB pattern, a Bayer pattern and a striped pattern.

18. A vehicle system as in claim 16, wherein said two or more spatially dispersed images are configured as a function of said patterned spectral filter.

19. A vehicle system as in claim 16, wherein said patterned spectral filter comprises at least one color selected from a group comprising: red, cyan, blue, green, blue-green, amber, infrared and ultra violet.

20. A vehicle system as in claim 14, wherein said lens is configured to split said first oriented light rays to form three or more spatially dispersed images.

21. A vehicle system as in claim 14, wherein said lens is configured to split said first oriented light rays to form four or more spatially dispersed images.

22. A vehicle system as in claim 14, wherein said two or more spatially dispersed images are linearly aligned.

23. A vehicle system as in claim 14, wherein said two or more spatially dispersed images define a checkerboard pattern with respect to one another.

24. The vehicle system as in claim 14, wherein the vehicle system is controlled based upon said two or more spatially dispersed images.

* * * * *

UNITED STATES PATENT AND TRADEMARK OFFICE
CERTIFICATE OF CORRECTION

PATENT NO. : 7,700,906 B2 Page 1 of 2
APPLICATION NO. : 12/017194
DATED : April 20, 2010
INVENTOR(S) : Joseph S. Stam and Jon H. Bechtel It is certified that error appears in the above-identified patent and that said Letters Patent is hereby corrected as shown below:

Column 3
Lines 1-14:

"Imaging systems are becoming commonplace in consumer electronics devices, residential systems, commercial systems and industrial applications. Consumer electronic devices include digital cameras, electronic video recorders, direct video devices (DVDs), digital video-telephones and the like. Residential systems include security systems, monitoring devices, surveillance systems, home entertainment systems and the like. Vehicle vision systems often incorporate imaging systems for equipment control, monitoring apparatus, warning devices and security systems. Industrial applications may include machine vision systems, control systems, monitoring systems and the like.

DETAILED DESCRIPTION OF THE INVENTION"

should be:

--DETAILED DESCRIPTION OF THE INVENTION

Imaging systems are becoming commonplace in consumer electronics devices, residential systems, commercial systems and industrial applications. Consumer electronic devices include digital cameras, electronic video recorders, direct video devices (DVDs), digital video-telephones and the like. Residential systems include security systems, monitoring devices, surveillance systems, home entertainment systems and the like. Vehicle vision systems often incorporate imaging systems for equipment control, monitoring apparatus, warning devices and security systems. Industrial applications may include machine vision systems, control systems, monitoring systems and the like.--.

Column 7
Line 62, "quadrants" should be --quadrant--.

Column 15
Line 39, "potion" should be --portion--.

Signed and Sealed this

Thirtieth Day of November, 2010

David J. Kappos
*Director of the United States Patent and Trademark Office*

Column 19
Claim 14, line 6, "a different color of said spectral filter" should be --a different color of a spectral filter--.